United States Patent
Cho et al.

(10) Patent No.: US 9,537,053 B2
(45) Date of Patent: ***Jan. 3, 2017

(54) III NITRIDE SEMICONDUCTOR DEVICE AND METHOD OF MANUFACTURING THE SAME

(71) Applicants: BBSA LIMITED, Wanchai, Hong Kong (CN); DOWA ELECTRONICS MATERIALS CO., LTD., Tokyo (JP)

(72) Inventors: Meoung Whan Cho, Yongin (KR); Seog Woo Lee, Yongin (KR); Ryuichi Toba, Akita (JP); Yoshitaka Kadowaki, Akita (JP)

(73) Assignees: BBSA LIMITED, Hong Kong (CN); DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/431,136

(22) PCT Filed: Sep. 28, 2012

(86) PCT No.: PCT/JP2012/075869
§ 371 (c)(1),
(2) Date: Mar. 25, 2015

(87) PCT Pub. No.: WO2014/049885
PCT Pub. Date: Apr. 3, 2014

(65) Prior Publication Data
US 2015/0263234 A1   Sep. 17, 2015

(51) Int. Cl.
*H01L 25/075* (2006.01)
*H01L 33/32* (2010.01)
(Continued)

(52) U.S. Cl.
CPC ............ *H01L 33/32* (2013.01); *H01L 27/153* (2013.01); *H01L 29/66742* (2013.01);
(Continued)

(58) Field of Classification Search
CPC ......... H01L 21/02; H01L 21/32; H01L 21/306
(Continued)

(56) References Cited

U.S. PATENT DOCUMENTS 9,184,338 B2 *   11/2015  Cho ..................... H01L 33/0079
2010/0187548 A1   7/2010  Onushkin et al.
2011/0114984 A1 *  5/2011  Seong ............... H01L 21/76254
257/98

FOREIGN PATENT DOCUMENTS

JP   2008-235883 A   10/2008
WO   2011/055462 A1   5/2011

OTHER PUBLICATIONS

Jan. 8, 2013 International Search Report issued in International Application No. PCT/JP2012/075869.
(Continued)

*Primary Examiner* — Ori Nadav
*Assistant Examiner* — Ernest Allen, III
(74) *Attorney, Agent, or Firm* — Oliff PLC

(57) ABSTRACT

Provided is a high quality III nitride semiconductor device in which, not only X-shaped cracks extending from the vicinity of the corners of semiconductor structures to the center portion thereof, but also crack spots at the center portion can be prevented from being formed and can provide a method of efficiently manufacturing the III nitride semiconductor device. The III nitride semiconductor device of the present invention includes a support and two semiconductor structures having a nearly quadrangular transverse cross-sectional shape that are provided on the support. The two semiconductor structures are situated such that one side
(Continued)

surface of one of the two semiconductor structures is placed to face one side surface of the other of them. The support covers the other three side surfaces and of the four sides of the semiconductor structures.

3 Claims, 21 Drawing Sheets

(51) Int. Cl.
    *H01L 33/38*     (2010.01)
    *H01L 33/00*     (2010.01)
    *H01L 29/66*     (2006.01)
    *H01L 29/786*     (2006.01)
    *H01L 27/15*     (2006.01)
    *H01L 21/306*     (2006.01)
    *H01L 21/02*     (2006.01)
    *H01L 21/32*     (2006.01)
    *H01L 33/44*     (2010.01)

(52) U.S. Cl.
    CPC ...... *H01L 29/78681* (2013.01); *H01L 33/007* (2013.01); *H01L 33/0075* (2013.01); *H01L 33/0079* (2013.01); *H01L 33/38* (2013.01); *H01L 21/02* (2013.01); *H01L 21/0254* (2013.01); *H01L 21/306* (2013.01); *H01L 21/32* (2013.01); *H01L 25/0753* (2013.01); *H01L 33/44* (2013.01); *H01L 2224/18* (2013.01); *H01L 2933/0016* (2013.01); *H01L 2933/0033* (2013.01)

(58) Field of Classification Search
    USPC ..................................... 257/88, 103; 438/33
    See application file for complete search history.

(56) References Cited

OTHER PUBLICATIONS

May 10, 2016 Office Action issued in Japanese Application No. 2014-538076.

\* cited by examiner

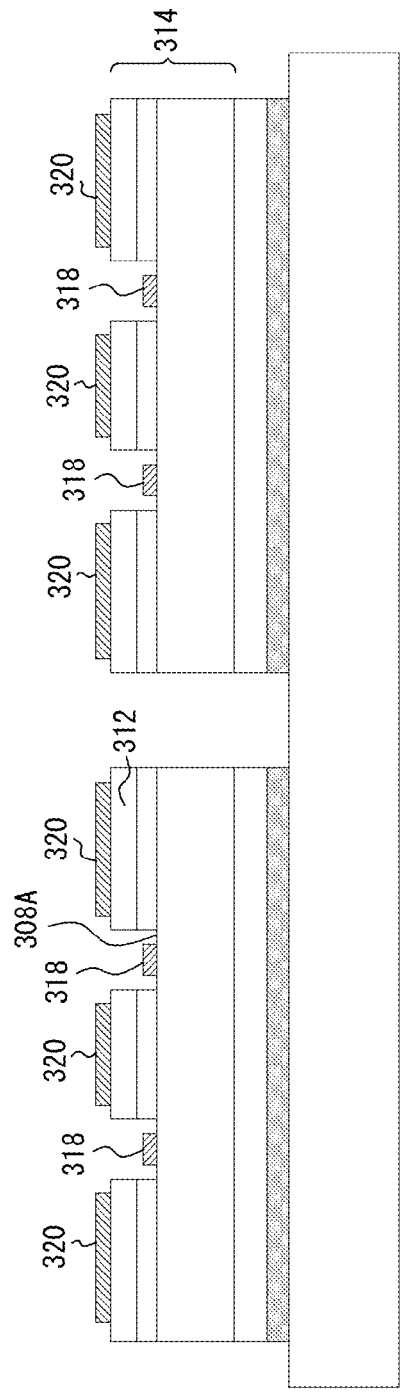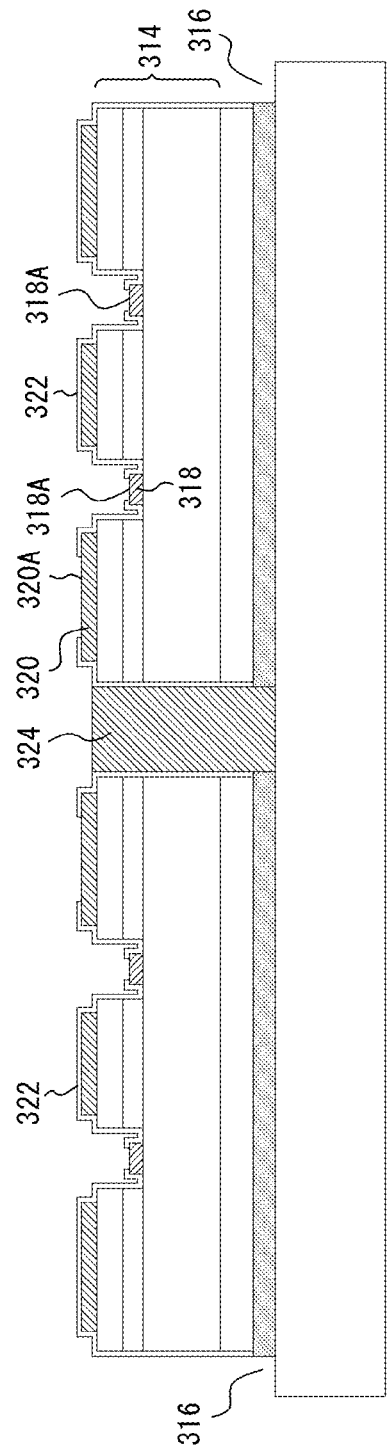

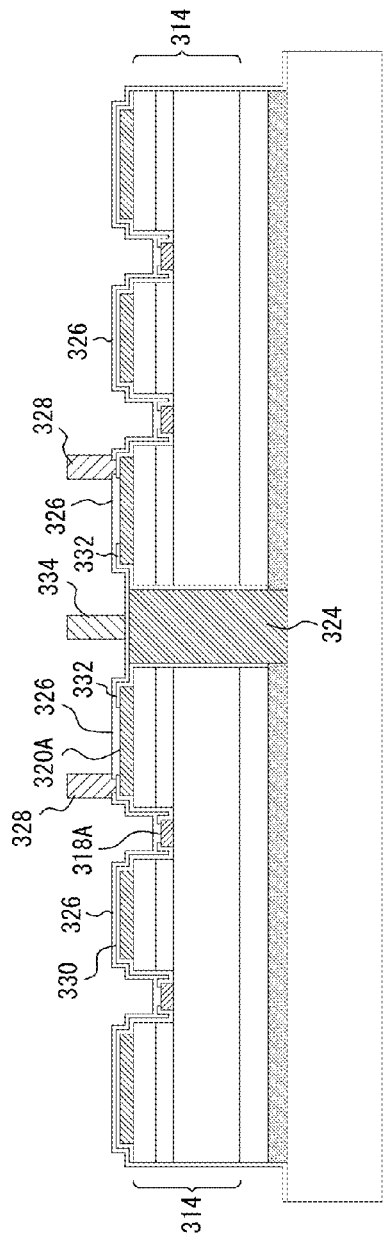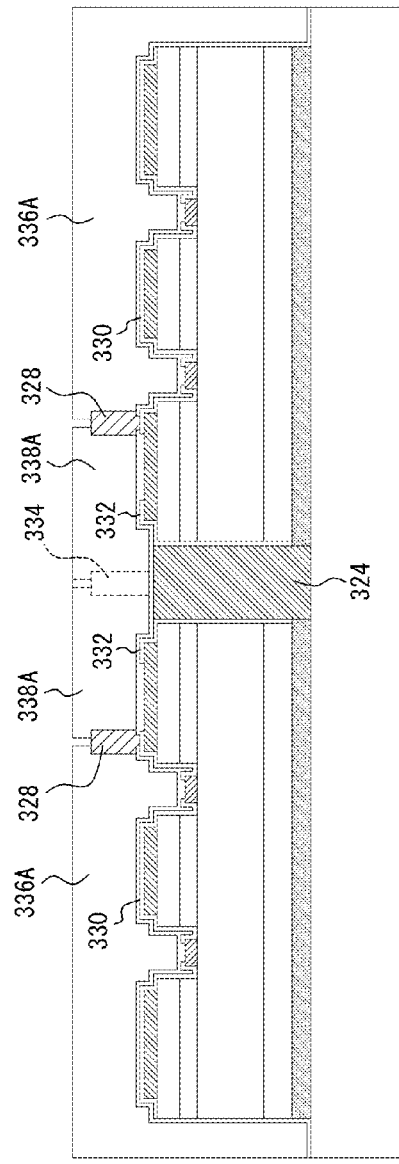

crack    crack crack

III NITRIDE SEMICONDUCTOR DEVICE AND METHOD OF MANUFACTURING THE SAME

TECHNICAL FIELD

The present invention relates to a III nitride semiconductor device and a method of manufacturing the same.

BACKGROUND

Examples of semiconductor devices include various devices, including field effect transistors (FETs), light emitting diodes (LEDs), and the like. For those semiconductor devices, for example, Group III-V semiconductors made of compounds of Group III and Group V elements are used.

A Group III nitride semiconductor using Al, Ga, In, or the like as a Group III element and using N as a Group V element has a high melting point and a high dissociation pressure of nitrogen, which makes it difficult to perform bulk single crystal growth. Further, conductive single crystal substrates having large diameter are not available at low cost. Accordingly, such a semiconductor is typically formed on a sapphire substrate.

However, a sapphire substrate is electrically insulating; accordingly, electric current does not flow in the substrate. Therefore, in recent years, methods of fabricating a vertical structure LED chip or the like, in which III nitride semiconductor layers are supported by a support have been studied, in which method the III nitride semiconductor layers including a light emitting layer is formed on a growth substrate such as a sapphire substrate, and after the support is separately bonded onto the III nitride semiconductor layers, the sapphire substrate is separated (lifted off).

As an example of those methods, a method of manufacturing vertically structured III nitride semiconductor LED chips that is described in WO 2011/055462 (PTL 1) will be explained with reference to FIGS. 19A to 20B. FIGS. 19A to 19F are schematic cross-sectional views illustrating the steps of a method of manufacturing conventional vertically structured III nitride semiconductor LED chips 500. First, a semiconductor laminate 503 is formed on a growth substrate 501 with a lift-off layer 502 therebetween by sequentially stacking a first conductivity type III nitride semiconductor layer 504, a light emitting layer 505, and a second conductivity type III nitride semiconductor layer 506 (FIG. 19A). Next, the semiconductor laminate 503 and the lift-off layer 502 are partly removed to expose the growth substrate 501, thereby forming a plurality of separate semiconductor structures 507 are formed by partly removing the semiconductor laminate 503 (FIG. 19B). Subsequently, a support 512 is formed, which integrally supports the plurality of semiconductor structures 507 and also serves as a lower electrode (FIG. 19C). Further, the lift-off layer 502 is removed using a chemical lift-off process, thereby separating the growth substrate 501 from the plurality of semiconductor structures 507 (FIG. 19D). After that, upper electrodes 516 are formed on the separation side of the semiconductor structures 507 (FIG. 19E); finally, the support 512 is divided by cutting or the like along the broken lines shown in FIG. 20A between the semiconductor structures 507, thus singulating the wafer into a plurality of LED chips 500 having respective semiconductor structures 507 supported by respective divided supports 512A (FIG. 19F).

FIG. 20A is a schematic top view of a wafer in a state of FIG. 19E where the plurality of semiconductor structures which have not been singulated are formed. FIG. 19E is a cross-sectional view taken along a broken line in FIG. 20A. FIG. 20B is a schematic side view of one of the LED chips 500 singulated along the broken lines in FIG. 20A. Thus, in PTL 1, through-grooves 514 are provided along cut lines of the singulation (broken lines) in portions of the support 512 located between adjacent semiconductor structures 507. Accordingly, when the lift-off layer 502 is removed as in FIGS. 19C to 19D, an etchant is supplied via the through-grooves 514 to surround the semiconductor structures 507. Further, the lift-off layer 502 right under the semiconductor structures 507 is etched from the outer peripheral portion of the semiconductor structures to the center portion thereof.

Here, in PTL 1, as shown in FIG. 20A, the transverse cross section of the semiconductor structures 507 has a circular shape or a 4 n-gon shape ("n" is a positive integer) having rounded corners. If the transverse cross section of the semiconductor structures has a 4 n-gon shape without rounded corners, X-shaped cracks extending from the vicinity of the corners to the center portion would be formed in the individual semiconductor structures at a considerable rate after the lift-off as shown in FIG. 21A. In PTL 1, the shape of the semiconductor structures is as described above, so that stresses can be prevented from being concentrated at the corners (the vectors of the etching proceeding from the periphery of the semiconductor structures meet) during etching; thus, the formation of the above X-shaped cracks can be prevented.

CITATION LIST

Patent Literature

PTL 1: WO 2011/055462

SUMMARY

However, according to further studies made by the inventors of the present invention, it has been found that in the method described in PTL 1, although cracks extending from the corners to the center of the individual semiconductor structures after lift-off can be effectively prevented, crack spots are newly formed at the center portion of the semiconductor structures at a considerable rate as shown in FIG. 21B. The formation of such crack spots is not addressed as an issue in any published patent literature or professional literature. However, this is a critical issue to be solved for achieving mass production of III nitride semiconductor devices. Further, it is also important for mass production to efficiently produce III nitride semiconductor devices by simplifying the production process.

In view of the above problem, it is therefore an object of the present invention to provide a high quality III nitride semiconductor device in which, when a lift-off layer is removed using a chemical lift-off process, not only X-shaped cracks extending from the vicinity of the corners of semiconductor structures to the center portion thereof, but also crack spots at the center portion can be prevented from being formed and to provide a method of efficiently manufacturing the III nitride semiconductor device.

In order to achieve the above object, the present invention primarily includes the following components.
(1) A method of manufacturing a III nitride semiconductor device, comprising the steps of:
a step of forming a semiconductor laminate obtained by sequentially stacking a first conductivity type III nitride semiconductor layer, an active layer, and a second conductivity type III nitride semiconductor layer on a growth substrate with a lift-off layer provided therebetween;

a step of partly removing the semiconductor laminate to form a plurality of grooves in a grid pattern such that the growth substrate is partly exposed at the bottom of the grooves, thereby forming a plurality of semiconductor structures having a nearly quadrangular transverse cross-sectional shape;

a step of filling up alternate lines of the plurality of grooves in one direction with a filler;

a step of forming a support for integrally supporting the plurality of semiconductor structures by plating;

a step of forming through-holes in the support, the through-holes communicating with the filler;

a step of forming gaps by removing the filler;

a step of supplying an etchant to the gaps from the through-holes, thereby etching the lift-off layer from only one side of each of the semiconductor structures to remove the lift-off layer;

a step of forming first and second electrodes electrically connected to the first and second conductivity-type III nitride semiconductor layers, respectively; and a singulation step for cutting the support along the plurality of grooves, wherein in the singulation step, the support is cut along at least part of the grooves other than the grooves provided with the filler, thereby manufacturing III nitride semiconductor devices in which the cut supports support respective m rows and n columns of the semiconductor structures (where m is a natural number, and n is an even number equal to or more than 2).

(2) The method of manufacturing a III nitride semiconductor device, according to (1) above, wherein in the singulation step, the support is cut along all the grooves other than the grooves provided with the filler, thereby manufacturing a III nitride semiconductor device in which the cut supports each support two semiconductor structures.

(3) The method of manufacturing a III nitride semiconductor device, according to (2) above, wherein at least one of the first and second electrodes also serves as the support, and a first part of the other of the first and second electrodes that is connected to one of the semiconductor structures and a second part thereof that is connected to the other of the semiconductor structures are placed adjacent to each other.

(4) A III nitride semiconductor device comprising:

a support;

two semiconductor structures having a nearly quadrangular transverse cross-sectional shape and having a second conductivity type III nitride semiconductor layer, an active layer, and a first second conductivity type III nitride semiconductor layer in this order, the semiconductor structures being provided on the support; and first and second electrodes electrically connected to the first and second conductivity-type III nitride semiconductor layers, respectively, wherein the two semiconductor structures are situated such that one side surface of one of the two semiconductor structures is placed to face one side surface of the other of them, and the support covers the other three side surfaces of the four sides of the semiconductor structures or two opposite side surfaces of the three side surfaces.

(5) The III nitride semiconductor device, according to (4) above, wherein at least one of the first and second electrodes also serves as the support, and a first part of the other of the first and second electrodes that is connected to one of the semiconductor structures and a second part thereof that is connected to the other of the semiconductor structures are placed adjacent to each other.

(6) The III nitride semiconductor device, according to (5) above, wherein the first and second electrodes both serve as the support.

(7) The III nitride semiconductor device, according to (5) above, wherein only one of the first and second electrodes serves as the support, and the other electrode is led from between the support and the semiconductor structures and is exposed between the two semiconductor structures.

(8) A III nitride semiconductor device, wherein the plurality of III nitride semiconductor devices according to any one of (4) to (7) above are integrated with the support, and the integrated III nitride semiconductor device has m rows and n columns of the semiconductor structures (where m is a natural number, and n is an even number equal to or more than 2).

Advantageous Effect of Invention

The present invention can provide a high quality III nitride semiconductor device in which, not only X-shaped cracks extending from the vicinity of the corners of semiconductor structures to the center portion thereof, but also crack spots at the center portion can be prevented from being formed and can provide a method of efficiently manufacturing the III nitride semiconductor device.

BRIEF DESCRIPTION OF THE DRAWINGS

FIGS. 9A and 9B are schematic cross-sectional side views showing steps following the step shown in FIG. 8B.

FIGS. 10A and 10B are schematic cross-sectional side views showing steps following the step shown in FIG. 9B.

FIG. 17A is a cross-sectional view of a part of a III nitride semiconductor device 400 in accordance with another embodiment of the present invention, whereas

FIG. 20A is a schematic top view of a wafer in a state of FIG. 19E where the plurality of semiconductor structures which have not been singulated are formed, whereas

FIG. 21A is a photograph showing cracks formed in a semiconductor structure of an LED chip obtained by another conventional manufacturing method, whereas

DETAILED DESCRIPTION

Figure 1A:
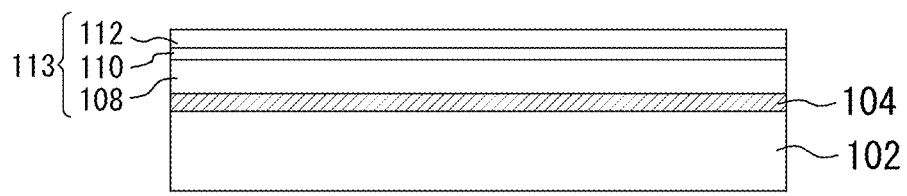
FIGS. 1A to 1C are vertical cross-sectional views schematically illustrating part of the steps of a method of manufacturing III nitride 30) semiconductor devices 100 according to an embodiment of the present invention.

Embodiments of the present invention will now be described with reference to the drawings. In principle, components that are common to III nitride semiconductor devices according to embodiments of the present invention are herein denoted by reference numerals having the same two last digits, and thus their descriptions will not be repeated.

Embodiment 1

Figure 2A:
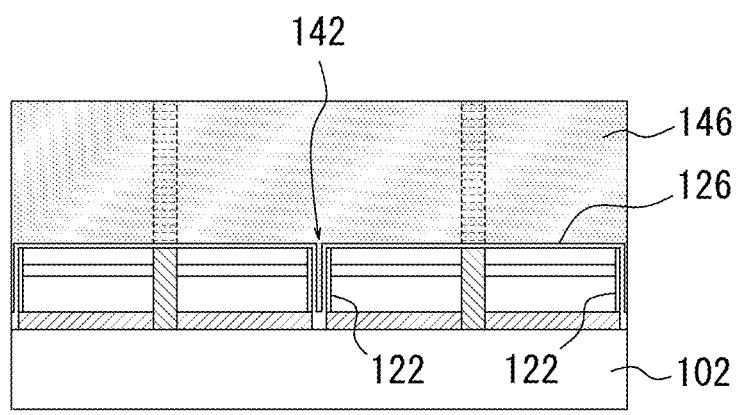
FIGS. 2A and 2B are schematic cross-sectional side views showing steps following the step shown in FIG. 1B.
Figure 3A:
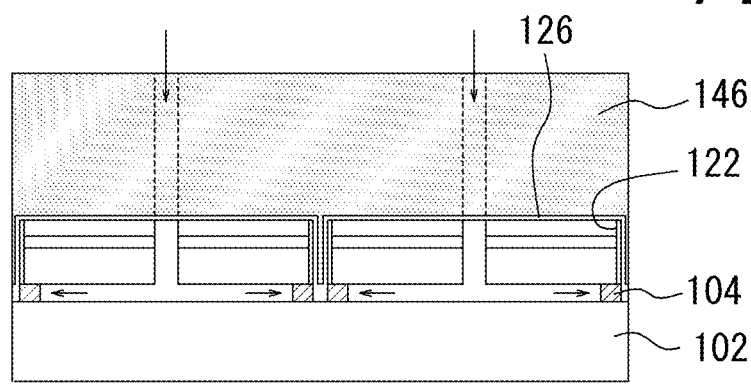
FIGS. 3A to 3C are schematic cross-sectional side views showing steps following the step shown in FIG. 2B.
Figure 3B:
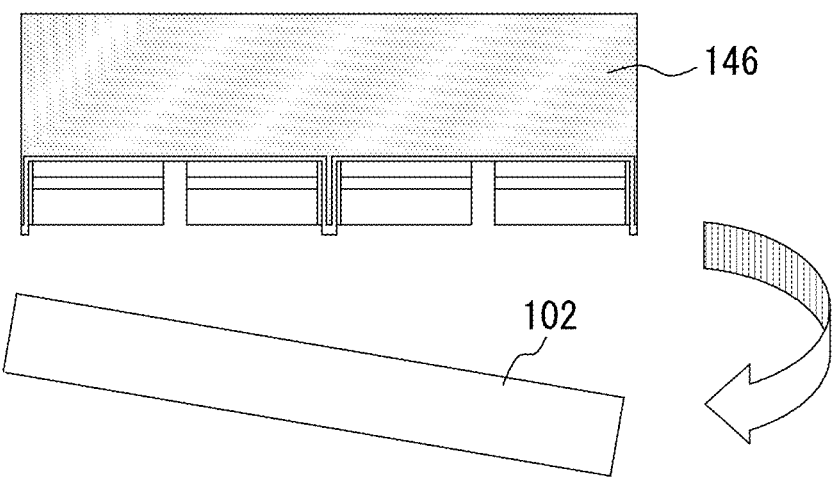
Figure 3C:
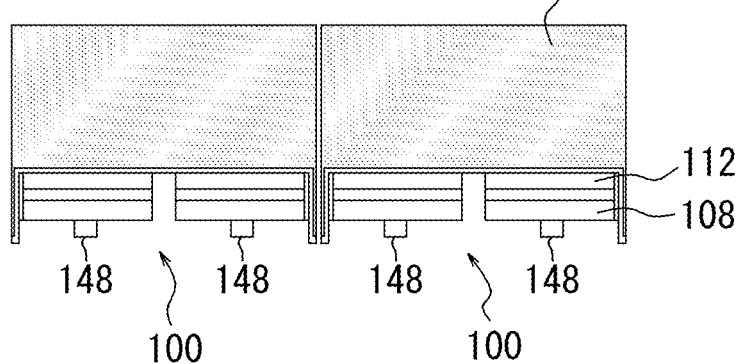
Figure 4A:
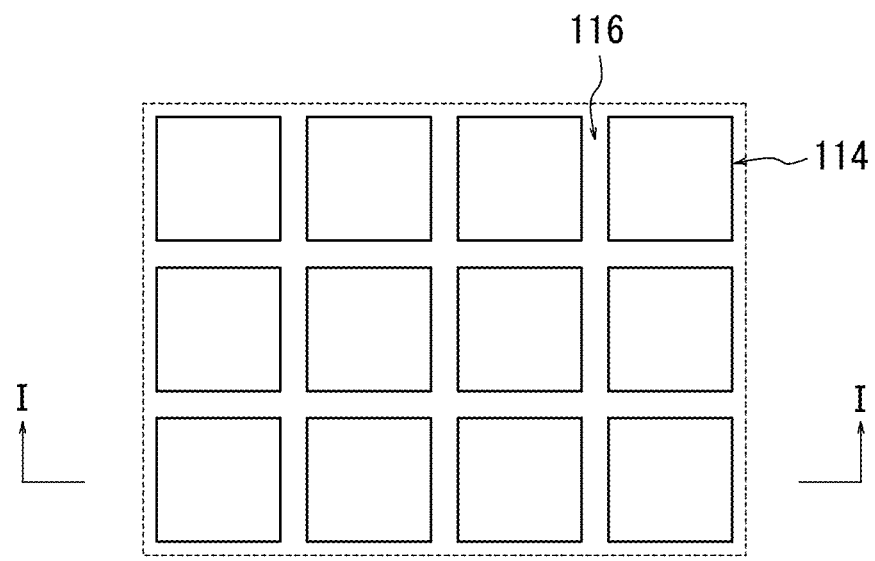
FIGS. 4A and 4B are transverse cross-sectional views schematically illustrating the states of FIG. 1B and FIG. 2A, respectively.
Figure 4B:
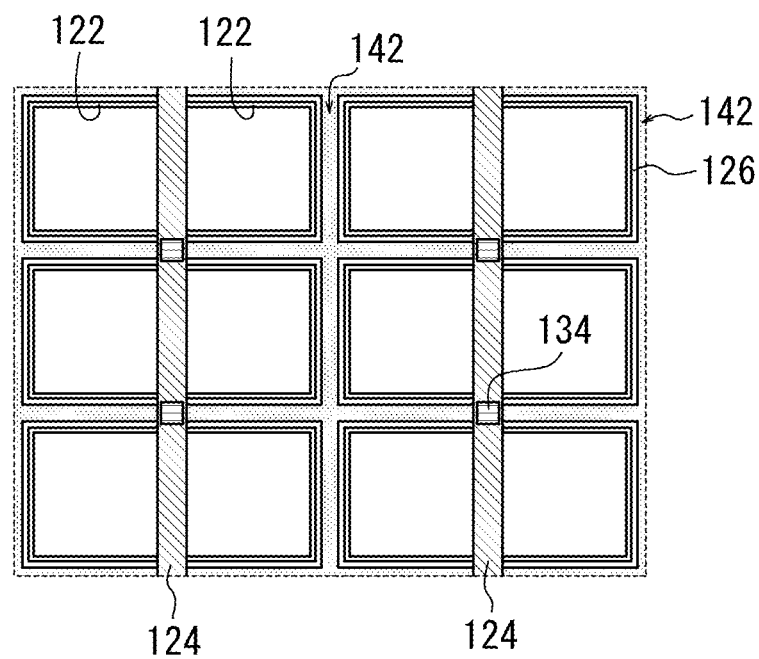
Figure 5A:
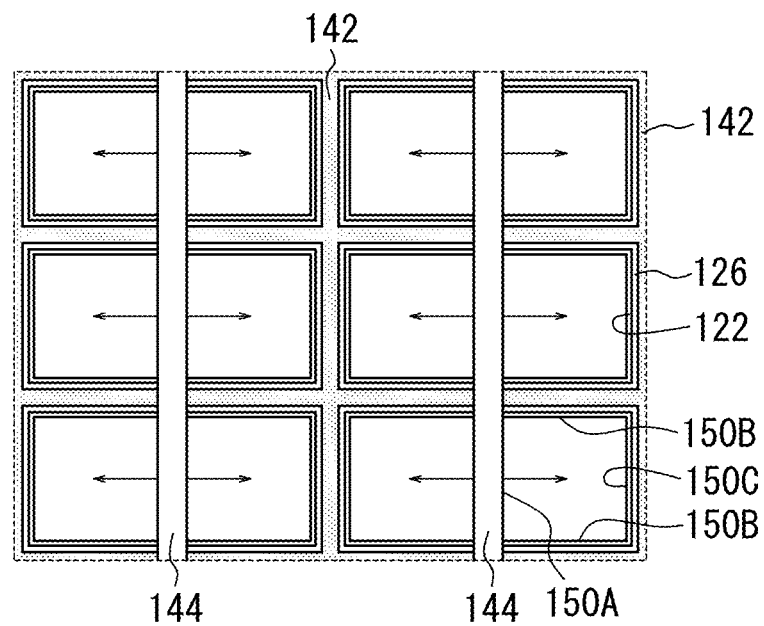
FIGS. 5A and 5B are transverse cross-sectional views schematically illustrating the states of FIG. 3A and FIG. 3B, respectively.
Figure 5B:
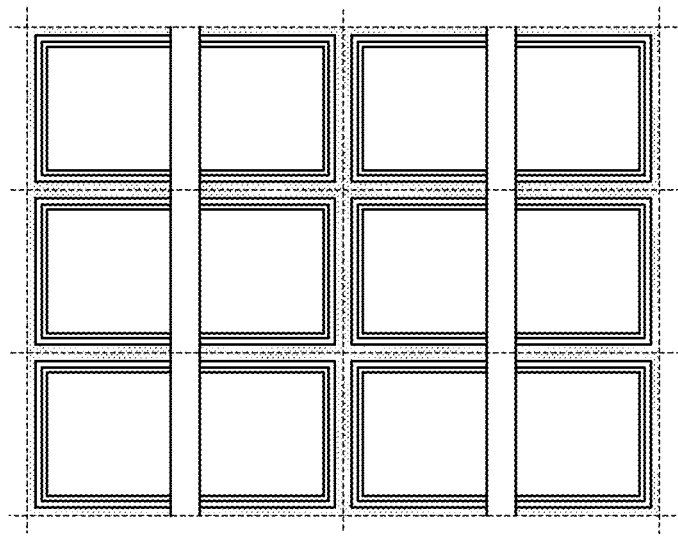

A method of manufacturing a III nitride semiconductor device 100 according to an embodiment of the present invention will be described with reference to FIGS. 1A to 3C and FIGS. 4A to 58B. First, the correlation between FIGS. 1A to 3C and FIGS. 4A to 5B will be described. FIG. 4A is a transverse cross-sectional view of an active layer 110 in a state shown in FIG. 1B, whereas the cross section along line I-I in FIG. 4A corresponds to FIG. 1B. Note that the cross-sectional views of other than FIG. 1B are of the same position, and a resin 134 is illustrated as a projection of the resin 134 at the position shown in FIG. 4B. Meanwhile, transverse sectional views other than FIG. 4A are also of the position of the active layer 110. FIG. 4B is a transverse sectional view of the state shown in FIG. 2A; however, the position of the resin 134 is added thereto. FIG. 5A is a transverse sectional view of the state shown in FIG. 3A. FIG. 5B is a transverse sectional view of the state shown in FIG. 3B.

Figure 1B:
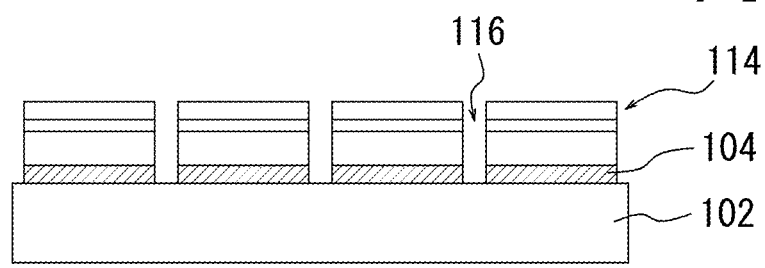

First, as shown in FIG. 1A, a first conductivity type n-type III nitride semiconductor layer 108, an active layer 110 and a second conductivity-type p-type III nitride semiconductor layer 112 are sequentially stacked to from a semiconductor laminate 113 on a growth substrate 102 with a lift-off layer 104 provided therebetween.

Next, as shown in FIG. 1B and FIG. 4A, the semiconductor laminate 13 is partly removed to form a plurality of grooves 116 in a grid pattern such that the growth substrate 102 is partly exposed at the bottom of the grooves, thereby forming a plurality of semiconductor structures 114 having a quadrangular transverse cross-sectional shape that are isolated like islands.

Next, as shown in FIG. 4B, alternate lines in the longitudinal direction of the grooves 116 in a grid pattern are filled up with a first resin 124 serving as a filler. Thus, only one side surface of each semiconductor structure 114 is covered with the first resin 124. Subsequently, insulating layers 122 are formed on the three side surfaces of each semiconductor structure 114 that are not covered with the first resin 124.

Figure 1C:
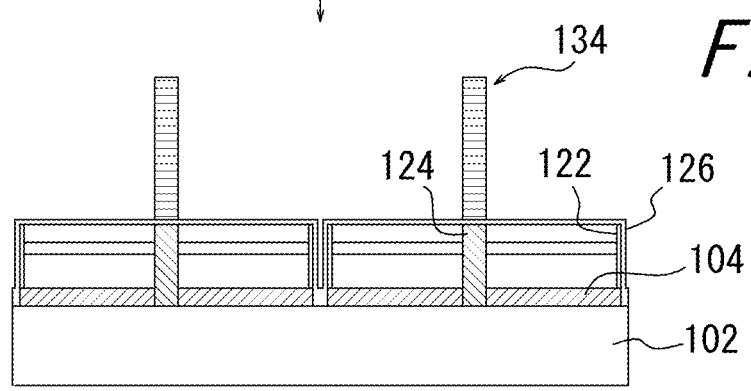

After that, as shown in FIG. 1C, a plating seed layer 126 is formed on the surface of the semiconductor structures 114, the surface of the first resin 124, and the exposed bottom of the grooves 116. At that time, the plating seed layer 126 is also formed on the surface of the insulating layers 122. Alternatively, only one side surface of each semiconductor structure 114 may be covered with the first resin 124 after the insulating layers 122 are formed on the three side surfaces. Further, in the actual process, it is difficult to form the insulating layer exclusively on the side surfaces even by photolithography. Therefore, while not illustrated, the insulating layer is preferably formed to extend from the side surfaces at least to part of the surface of each semiconductor structure 114 (the peripheral portions of the surface which are adjacent to the side surfaces) and to part of the bottom of the grooves 116.

Next, pillars of a second resin 134 extending upward from the surface 3i of the plating seed layer 126 on the first resin 124 are formed at a given position above the surface of the first resin 124, at the position shown in FIG. 4B in this embodiment. Although not in the cross section along the line I-I, FIG. 1C and FIG. 2A also show a projection of the pillars of the second resin 134. After that, as shown in FIG. 2A, a support 146 is grown on the plating seed layer 126 by plating. Here, as shown with the halftone dots in FIGS. 4A and 4B, grooves 116 which are not filled up with the first resin 124 are filled with the same material as the support 146, and the concerned portions are referred to as embedded parts 142. In other words, in this embodiment, the support 146 also serves as the embedded parts 142.

Figure 2B:
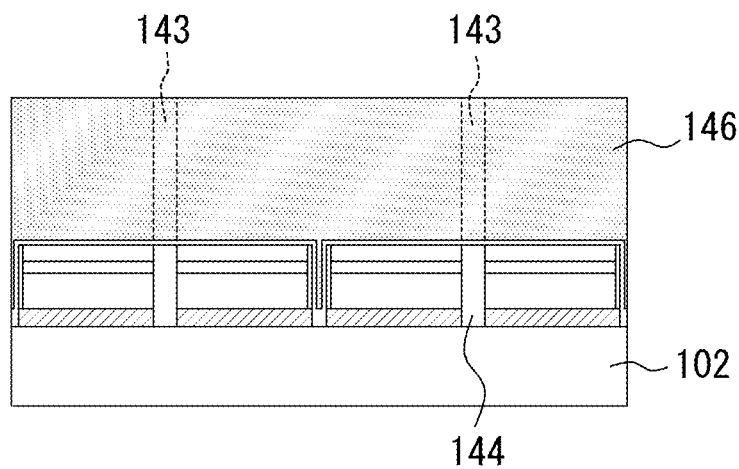

After that, as shown in FIG. 2B, the second resin 134 is removed using a solvent (such as acetone) thereby forming through-holes 143 in the support 146 that communicate with the first resin 124. FIG. 2B shows the projection of the columnar through-holes 143 by the broken lines. Further, the plating seed layer and the first resin 124 that are right under the through-holes 143 are removed via the through-holes 143, thereby forming gaps 144 in the grooves 116 having been filled up with the first resin 124. As a result, the through-holes 143 serve as paths that communicate with the gaps 144 and connect the lift-off layer 104 to the external.

Next, a step is performed to remove the lift-off layer 104 using a chemical lift-off process. In this embodiment, as shown in FIG. 5A, one side surface 150A of each semiconductor structure 114 faces one of the grooves 116 in which the gaps 144 are formed, and the other three side surfaces 150B and 150C face the grooves 116 filled up with the embedded parts 142. In other words, the embedded parts 142 are formed in the grooves so as to cover all of the other three side surfaces 150B and 150C of each semiconductor structure 114. An etchant is supplied only to the grooves 116 turned into the gaps 144 are formed, via the through-holes 143 and is not supplied to the grooves 116 filled up with the embedded parts. Accordingly, as shown by the arrows in FIG. 5A and FIG. 3A, the lift-off layer 104 is etched from the one side surface 150A of each semiconductor structure 114 toward the opposite side surface 150C. Specifically, the embedded parts 142 serve to allow an etchant to be supplied only to the one side surface 150A of the four side surfaces of each semiconductor structure 114, which is firstly etched, and to inhibit the etchant from being supplied to the other three side surfaces 150B and 150C.

In this embodiment, even after the lift-off layer 104 is removed, the growth substrate 102 is not separated from the semiconductor structures 114, since the plating seed layer 126 right under the embedded parts 142 is in contact with the growth substrate 102. With this being the case, as shown in FIG. 3B, regions of the plating seed layer 126 that are in contact with the growth substrate 102 are removed to separate the growth substrate 102.

Finally, the singulation step for cutting the support 146 along the plurality of grooves 116 is performed. In this embodiment, as shown in portions enclosed by the broken lines in FIG. 5B, the support 146 is cut along all the grooves other than the grooves provided with the first filler 124, so that a plurality of III nitride semiconductor devices 100 in which the cut supports 146A each support two semiconductor structures 114 can be obtained as shown in FIG. 3C. Further, n-side electrodes 148 electrically connected to the n-type III nitride semiconductor layers 108 are formed on the separation side of the semiconductor structures 114. The supports 146A also serve as p-side electrodes electrically connected to the p-type III nitride semiconductor layers 112. Note that the number of cut portions can be reduced by excluding part of the broken lines in FIG. 5B, thereby manufacturing III nitride semiconductor devices in which m rows and n columns of the semiconductor structures (where m is a natural number, and n is an even number equal to or more than 2) are supported.

The inventors of the present invention found that cracks can be substantially prevented from being formed in the semiconductor structures 114 by supplying an etchant through the gaps 144 thereby etching the lift-off layer 104 in one direction from one side surface 150A of each semiconductor structure 114 toward the side surface 150C opposite to the side surface 150A.

The technical meaning of the present invention will be described below with the operation and effects. The inventors made various studies on the form of crack spots formed at a center region of the semiconductor structures. When an etchant is supplied from the peripheral portion of the semiconductor structures as in PTL 1, the lift-off layer is etched from the peripheral portion to the center portion. In this case, it was found that the local stresses are applied to the dissolution front portion where the semiconductor structures are detached from the growth substrate, that is, the boundary region between a portion of each semiconductor structure, which is attached to the growth substrate with the lift-off layer therebetween and a portion thereof which is detached from the growth substrate, thus forming cracks. When the etching on the lift-off layer is about to be completed, the lift-off layer still remains at the center portion, which leads to the formation of cracks due to stresses concentrated at the center portion.

On the other hand, in this embodiment, the process of etching, and the operation and effects of the etching are as follows. When the lift-off layer is etched first from only the one side surface 150A of each semiconductor structure 114, the above dissolution front portion translates from the side surface 150A to the opposite side surface 150C, remaining in a straight line. Therefore, stresses can be prevented from being concentrated at the center portion of the semiconductor structures 114 in the final stage where etching of the lift-off layer 104 is completed. Consequently, crack spots can be prevented from being formed at the center portion of the semiconductor structures 114. Further, since etching is performed in one direction, stresses are not concentrated at the corners. Accordingly, X-shape cracks, which are greatly extended from the corners to the center portion, can also be prevented from being formed.

Further, in this embodiment, the transverse cross-sectional shape of the semiconductor structures is not necessarily circular or rounded at the corners but can be quadrangular. This can reduce the loss of the effective area per wafer. In other words, the combined effects of the suppression of crack formation and the increase in the effective area can increase the yield per wafer.

Further, in this embodiment, III nitride semiconductor devices can be efficiently manufactured by reducing the number of cuttings than in the case of cutting the support 146 along all the grooves 116 including the grooves provided with the first resin 124. Further, as compared with the case of cutting along the grooves provided with the first resin 124, there is less risk of debris and the like, so that the side surface 150A that is one of the surfaces of each semiconductor structure can easily be protected.

Figure 6:
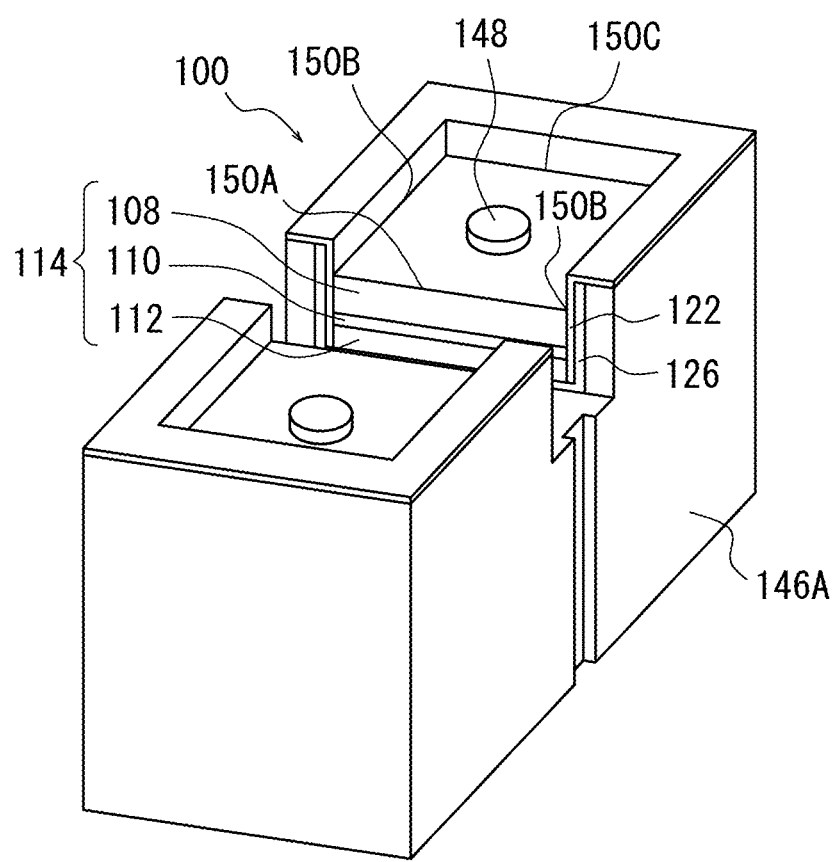
FIG. 6 is a schematic perspective view of a III nitride semiconductor device 100 in accordance with one embodiment of the present invention.

FIG. 6 is a schematic perspective view of a III nitride semiconductor device 100 which can be obtained by the above manufacturing method according to the present invention. The device 100 has a support body 146A and two semiconductor structures 114 having a nearly quadrangular transverse cross-sectional shape on the support 146A. The semiconductor structures 114 have a p-type III nitride semiconductor layer 112, an active layer 110, and an n-type III nitride semiconductor layer 108 in this order. The two semiconductor structures 114 are situated such that one side surface 150A of one of the two semiconductor structures 114 is placed to face one side surface 150A of the other of them. Further, the support 146A covers the three side surfaces 150B and 150C of the four side surfaces of the semiconductor structures 114. Note that the insulating layers 122 and the plating seed layer 126 are situated between the three side surfaces and the support 146A. In the III nitride semiconductor device 100, the support 146A serves as a p-side electrode and is paired with an n-side electrode 148 provided on the semiconductor structure 114.

A variant of Embodiment 1 will now be described. An example of providing the embedded parts 142 in the grooves 116 so as to cover all of the three side surfaces 150B and 150C has been described above, yet the present invention is not limited thereto. For example, the embedded parts may be provided in the grooves 116 so as to cover the opposite two side surfaces 150B, whereas the grooves facing the side surfaces 150C may be empty or may be filled with a material different from that of the conductive supports. Examples of the filling include a resin that remains due to the absence of any pathway for introducing a solution in which the resin is dissolved, such as acetone. If there is no pathway for the introduction of acetone, the resin 30) cannot be removed before the removal of the lift-off layer, so that the etchant is not supplied to the grooves facing the side surfaces 150C. Even with such a structure, the embedded parts of the two opposite side surfaces 150B inhibit the supply of the etchant to the side surfaces 150C, and the etchant supply is limited to the path from the through-holes 143 to the gaps 144, which allows etching of the lift-off layer 104 to start only from the one side surfaces 150A.

However, if the grooves facing side surfaces 150C are empty, the etchant flows into such grooves upon completion of the etching of the lift-off layer 104, which would cause cracks at the edge of the surface of the semiconductor structures 114 on the side surface 150C side. For this reason, it is preferable that such grooves are not emptied by the etching of the lift-off layer but are filled with embedded parts that can be removed after the completion of the etching.

Figure 7:
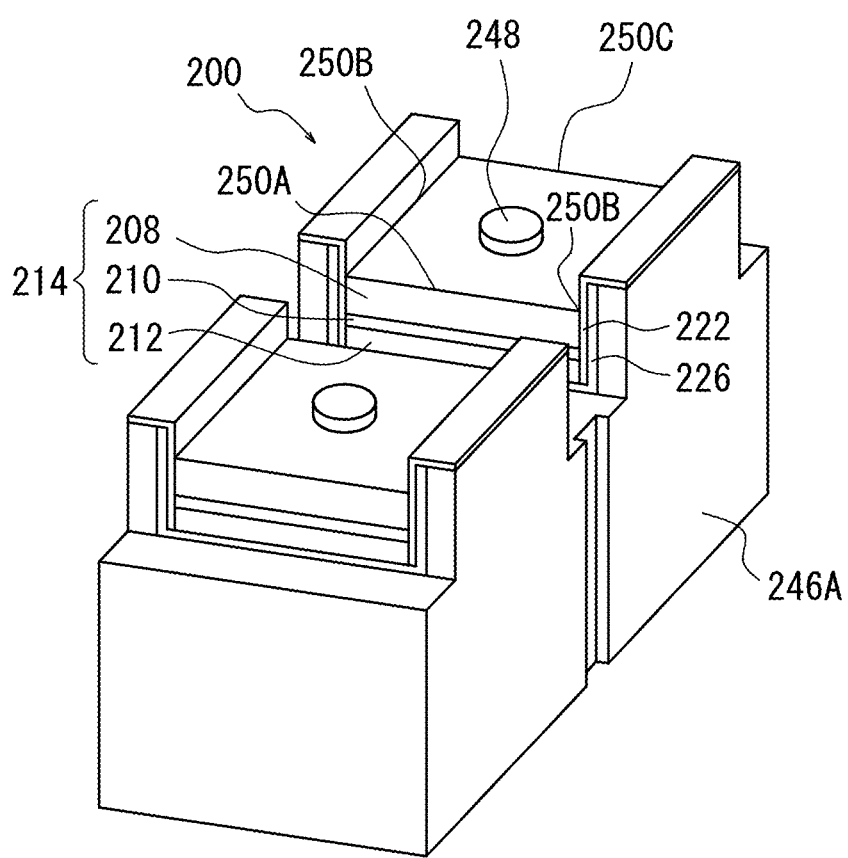
FIG. 7 is a schematic perspective view of a III nitride semiconductor device 200 in accordance with another embodiment of the present invention.

FIG. 7 is a schematic perspective view showing a III nitride semiconductor device 200 that can be obtained by this variant. The device 200 has a support body 246A and two semiconductor structures 214 having a nearly quadrangular transverse cross-sectional shape on the support body 246A. The semiconductor structures 214 have a p-type III nitride semiconductor layer 212, an active layer 210, and an n-type III nitride semiconductor layer 208. The two semiconductor structures 214 are situated such that one side surface 250A of one of the two semiconductor structures 214 is placed to face one side surface 250A of the other of them, and the support 246A cover two opposite surfaces 250B of the four side surfaces of the semiconductor structures 214. The side surface 250C is exposed. Note that the insulating layers 222 and the plating seed layer 226 are situated between the side surfaces 250A and the support 246A. In the device 200, the support body 246A serves as a p-side electrode and is paired with an n-side electrode 248 provided on the semiconductor structure 214.

Embodiment 2

Figure 15A:
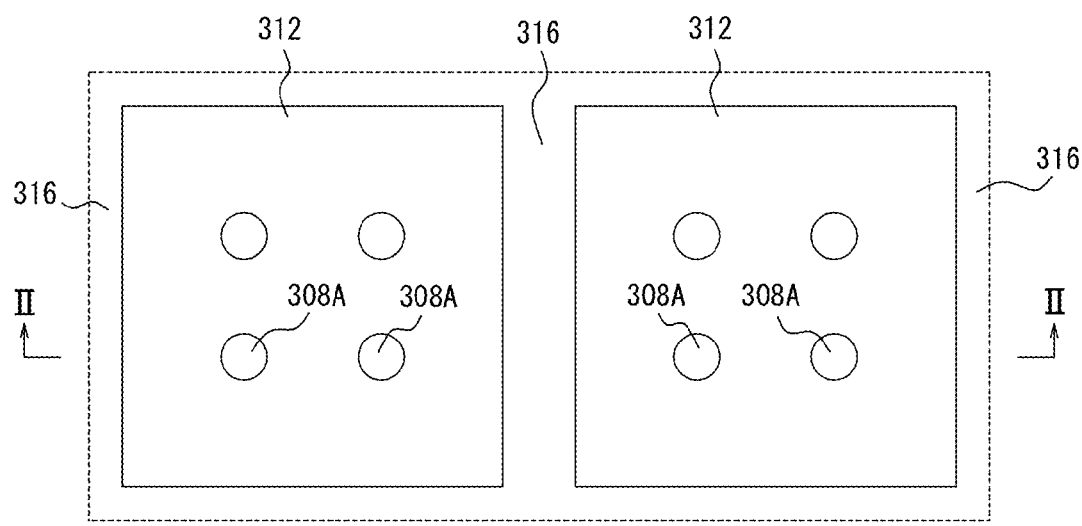
FIGS. 15A and 15B are schematic top views of FIG. 8B and FIG. 9A, respectively.
Figure 15B:
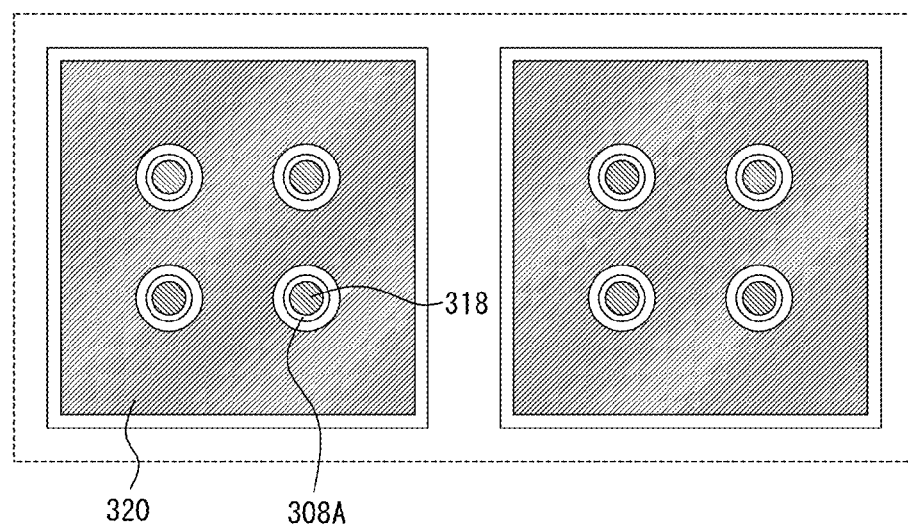
Figure 16A:
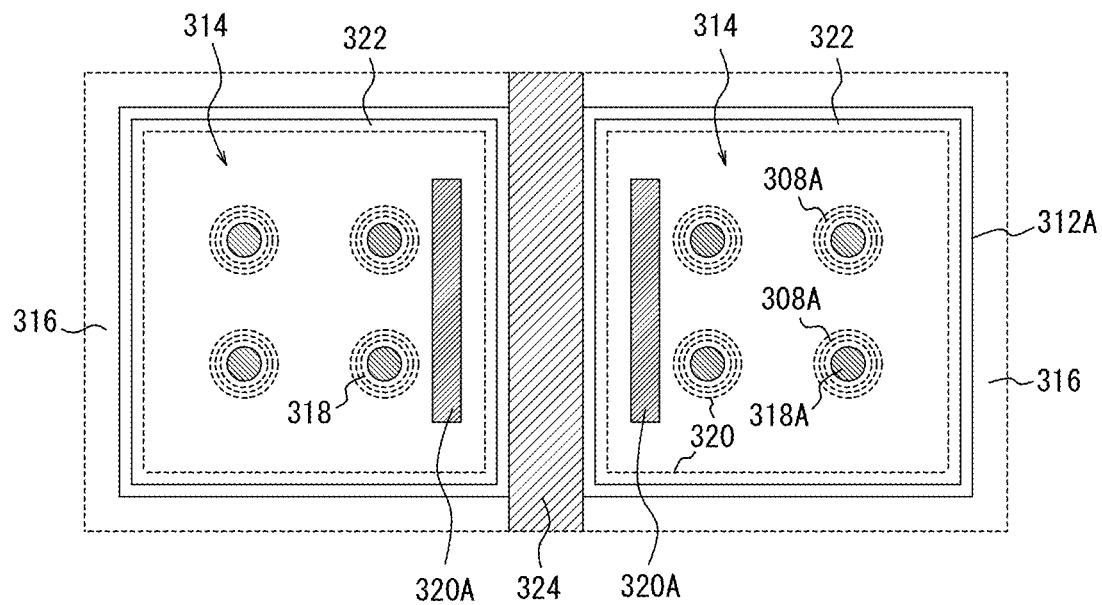
FIGS. 16A and 16B are schematic top views of FIG. 9B and FIG. 10B, respectively.
Figure 16B:
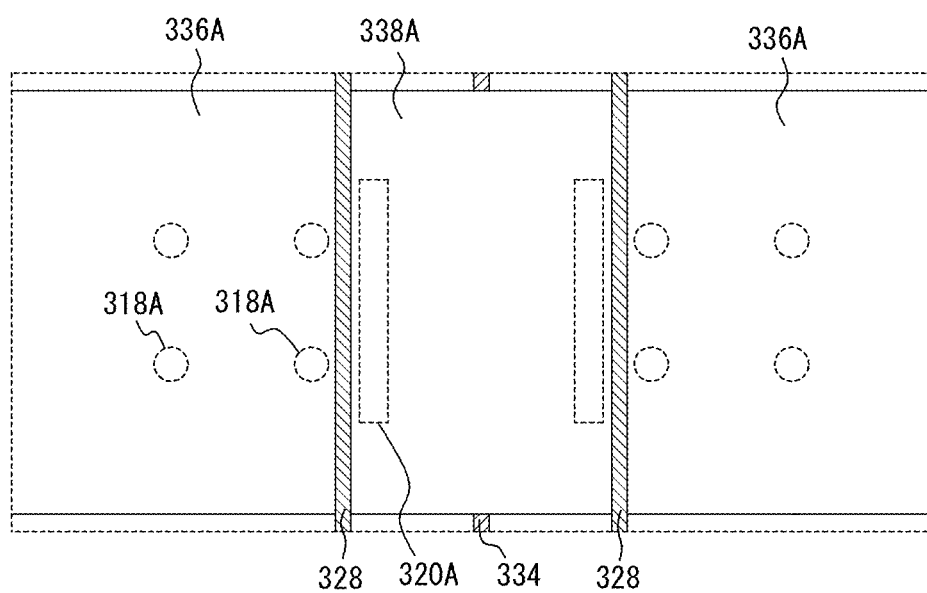

Next, a method of manufacturing III nitride semiconductor device 300 according to another embodiment of the present invention will be described with reference to FIGS. 8A to 16B. Now, the correspondence between the cross-sectional views of FIGS. 8A to 14 and the top views of FIGS. 15A to 16B is described first. FIG. 15A is a top view corresponding to FIG. 8B, and the cross section along line II-II in FIG. 15A corresponds to FIG. 8B. Note that the cross-sectional views of other than FIG. 8B are of the same position, and a second resin 334 and a third resin 341 are illustrated as a projection of the second resin 334 at the position shown in FIG. 16B. FIG. 15B is a top view corresponding to FIG. 9A. FIG. 16A is a top view corresponding to FIG. 9B. FIG. 16B is a top view corresponding to FIG. 10B.

Figure 8A:
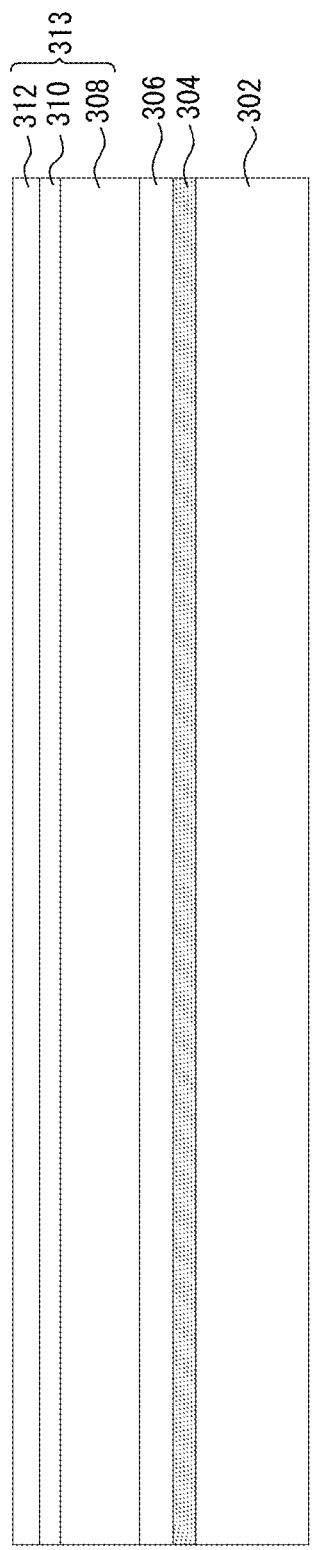
FIGS. 8A and 8B are vertical cross-sectional views schematically illustrating part of the steps of a method of manufacturing III nitride semiconductor devices 300 according to another embodiment of the present invention.
Figure 8B:
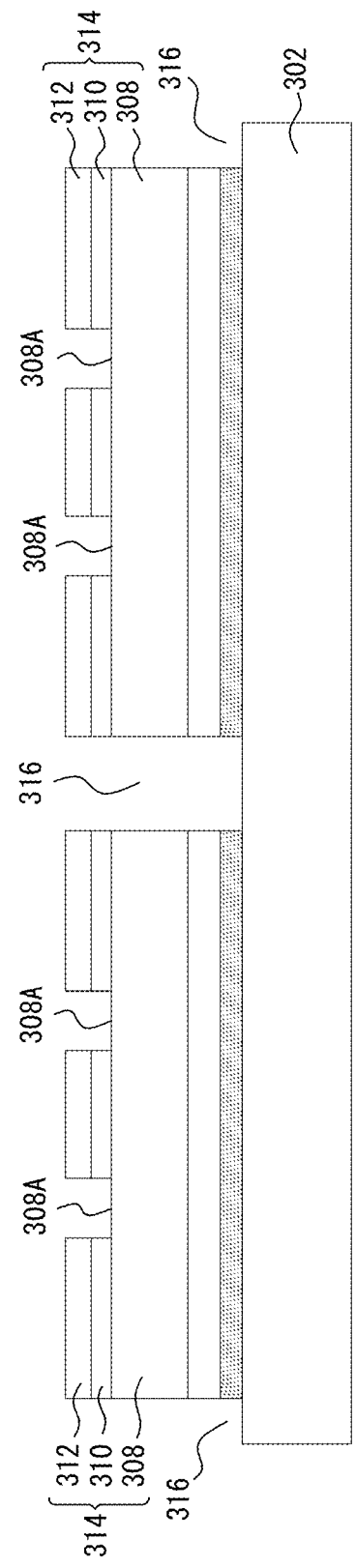

First, a lift-off layer 304 is formed on a growth substrate 302 as shown in FIG. 8A. An i-type III nitride semiconductor layer 306 (hereinafter referred to as "i-layer") is formed as a buffer layer on the lift-off layer 304 and an n-type III nitride semiconductor layer 308 (hereinafter referred to as "n-layer") having a first conductivity type is formed active layer 310, and p-type III nitride semiconductor layer 312 (hereinafter referred to as "p-layer") having a second conductivity-type are then formed sequentially, thereby forming a semiconductor laminate 313. Note that the i-type III nitride semiconductor layer refers to a layer that is not intentionally doped with any specific impurities (undoped layer). Ideally, a semiconductor completely free of impurities is preferred, yet a semiconductor that does not work as a p-type or n-type electrical conductor may be used, and one having low carrier concentration (for example, less than $5 \times 10^{16}/cm^3$) can be referred to as i-type semiconductor.

Next, as shown in FIG. 8B and FIG. 15A, the p-layer 312, the active layer 310, the n-layer 308, and the i-layer 306 are partly removed to form a plurality of grooves 316 in a grid pattern such that the growth substrate 302 is partly exposed at the bottom of the grooves, thereby forming a plurality of semiconductor structures 314 having a quadrangular transverse cross-sectional shape that are composed of the n-layer 308, the active layer 310, and the p-layer 312; and arranged longitudinally and laterally. Note that the combination of the growth substrate 302 and all the structures formed thereon are referred to as "wafer".

Subsequently, the p-layer 312 and the active layer 310 of each semiconductor structure 314 are partly removed to partly expose the n-layer 308 as shown in FIG. 8B and FIG. 15A. In this embodiment, a plurality of exposed portions 308A of the n-layer are circular and formed (at four positions) in each of the semiconductor structures 314. However, considering the length through which the current flows (current spreading length) depending on the layer composition of the semiconductor structures 314, and the chip size, the positions where the exposed portions are arranged and the number of the exposed portions to be arranged can be determined as appropriate.

Next, as shown in FIG. 9A and FIG. 15B, circular n-side contact layers 318 as first contact layers are formed on the respective exposed portions 308A of the n-layer, and p-side contact layers 320 as second contact layers are formed on substantially the entire surface of the p-layer 312.

Next, insulating layers 322 are formed as shown in FIG. 9B and FIG. 16A. The insulating layers 322 are formed on the exposed surface of the exposed area of the semiconductor structures 314, on the n-side contact layers 318, and on the p-side contact layers 320. However, as shown in those drawings, the insulating layers 322 are not formed on part of the n-side contact layers 318 and part of the p-side contact layers 320 to expose them. In this embodiment, the exposed portion 318A of each n-side contact layer is circular at the center of the n-side contact layer 318. Further, the exposed portion 320A of each p-side contact layer linearly extends between an end portion 312A of the p-layer 312 and the exposed portion 308A of the n-layer that is closest to the end portion 312A in the top view (FIG. 16A). Here, as shown in FIG. 16A, the exposed portion 320A is provided to the right in the semiconductor structure on the left side, whereas the exposed portion 320A is provided to the left in the semiconductor structure on the right side. Although not shown in FIG. 16A, the same structures are continuously provided upward and downward in the diagram, and the unit structure shown in the diagram is repeated to the right and left. In FIG. 16A, areas where the exposed portions 308A of the n-layer, the n-side contact layer 318, and the p-side contact layer 320 are covered with the insulating layer 322 are shown by broken lines. Note that the shape of the exposed portions 308A for the formation of the n-side contact layer is not necessarily circular, but can be concentric, interdigitated, or the like.

As shown in FIG. 9B and FIG. 16A, alternate lines of the grooves 316 in a grid pattern are then filled up with a first resin 324 in the longitudinal direction. Thus, only one side surface of each semiconductor structure 314 is covered with the first resin 324 as in Embodiment 1. In this embodiment, as shown in FIG. 9A, the grooves sandwiched between adjacent exposed portions 320A are filled up with the first resin 324. Note that the first resin 324 is removed in a subsequent step.

Next, a plating seed layer 326 is formed on substantially the whole exposed top surface of the wafer as shown in FIG. 10A. On that occasion, in each of the semiconductor structures 314, the plating seed layer 326 is not formed in a line almost parallel to the exposed portions 320A of the p-side contact layer on the insulating layers 322 between the exposed portions 320A of the p-side contact layer and the exposed portions 318A of the n-side contact layer, so that the insulating layers 322 are partly exposed.

As shown in FIG. 10A, in each semiconductor structure 314, on part of the insulating layer 322, specifically, so as to cover an exposed portion of the insulating layer 322, where the plating seed layer 326 is not formed, a first structure 328 made of an insulator is then formed across the exposed surface. The exposed surface is partitioned by the first structure 328 into a first exposed surface 330 including the exposed portions 318A of the n-side contact layers and a second exposed surface 332 including the exposed portion 320A of the p-side contact layer. Note that the first and second exposed surfaces 330 and 332 are defined as exposed surfaces excluding the plating seed layer 326. In this embodiment, as shown in FIG. 10A, in the semiconductor structure 314 on the left side, the first exposed surface 330 is on the left side of the first structure 328, and the second exposed surface 332 is on the right side thereof, whereas the semiconductor structure 314 on the right side has the opposite structure. Thus, the second exposed surfaces 332 of the two semiconductor structures 314 are adjacent to each other.

As shown in FIG. 10A, pillars of the second resin 334 are then formed on the first resin 324 with the plating seed layer 326 provided therebetween. The position of the second resin 334 is the position shown in FIG. 16B in this embodiment. The second resin 334 is also removed in a subsequent step.

Next, plating layers are grown from the respective first and second exposed surfaces 330 and 332. In this embodiment, that step includes a first plating step shown in FIG. 10B and FIG. 16B, a second structure formation step shown in FIG. 11, and a second plating step shown in FIG. 12.

First, in the first plating step, as shown in FIG. 10B and FIG. 16B, a first layer 336A of a first support body is formed on the first exposed surface 330, whereas a first layer 338A of a second support body is grown on the second exposed surface 332 by plating. The plating growth is terminated in a stage where the first layer 336A and the first layer 338A do not join. Note that the first layers 338A of adjacent semiconductor structures are coupled but the second resin 334 is not buried in the plating. As shown in FIG. 16B, the first layer 336A of the first support body is in contact with the exposed portions 318A of the n-side contact layers (broken lines in the diagram), whereas the first layer 338A of the second support body is in contact with the exposed portions 320A of the p-side contact layers (broken lines in the diagram). The first structure 328 is located between the first layers 336A and 338A of the first and second support bodies.

Subsequently, as shown in FIG. 1I, a second structure 340 made of an insulator and coupled to the first structure 328 is formed on the first layer 336A of the first support body. In this embodiment, the second structure 340 is formed in a line having a longer width than the first structure 328. In addition, pillars of the third resin 341 coupled to the second resin 334 are formed on the second resin 334. The position of the third resin 341 is also the position of the second resin 334 shown in FIG. 16B in this embodiment.

Figure 12:
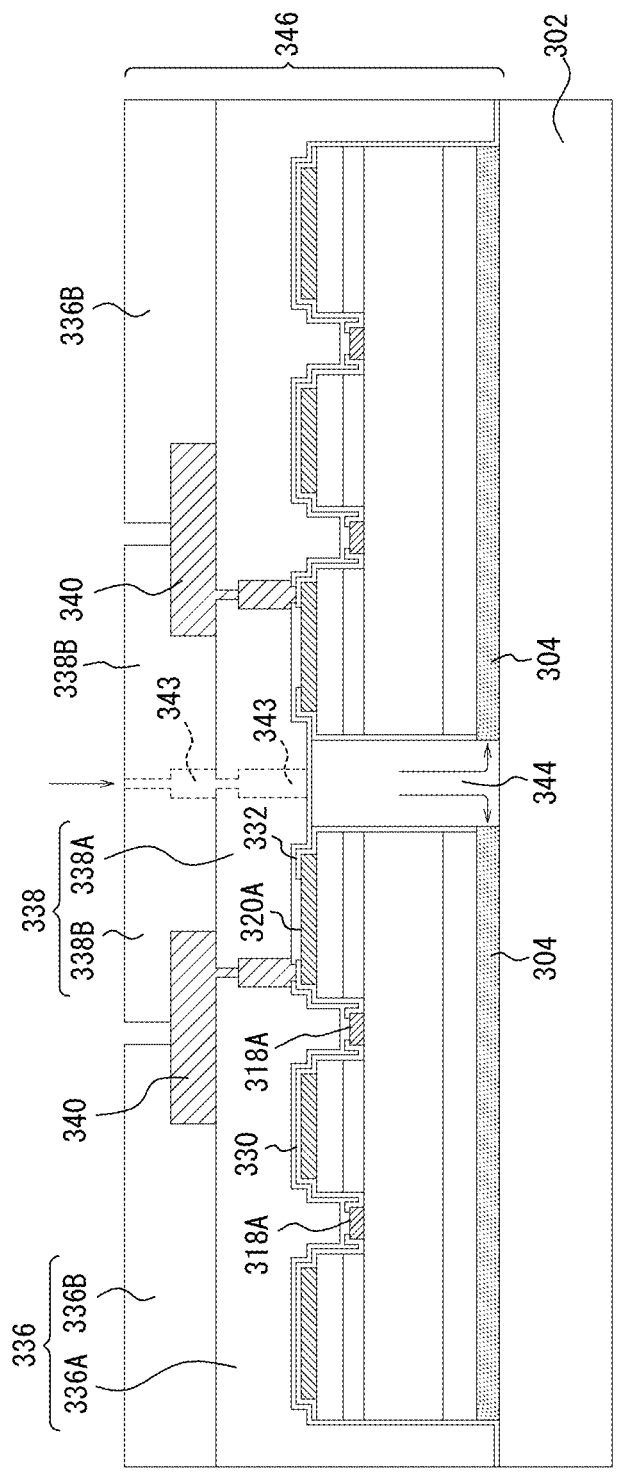
FIG. 12 is a schematic cross-sectional side view showing the step following the step shown in FIG. 11.

Subsequently, in the second plating step, as shown in FIG. 12, a second layer 336B of the first support body and a second layer 338B of the second support body are grown further by plating from the first layer 336A of the first support body and the first layer 338A of the second support body that are exposed, respectively. The plating growth is terminated in a stage where the second layer 336B and the second layer 338B do not join. Note that the second layers 338B of adjacent semiconductor structures are coupled but the third resin 341 is not buried in the plating. The second structure 340 is located between the second layers 336B and 338B of the first and second support bodies.

Thus, a first support body 336 can be formed on the first exposed surface 330 so as to be connected to the exposed portions 318A of the n-side 36 contact layers to serve as an n-side electrode which is a first electrode, whereas a second support body 338 can be formed on the second exposed surface 332 so as to be connected to the exposed portions 320A of the second contact layers to serve as a p-side electrode which is a second electrode. On this occasion, as is apparent from FIG. 12, due to the position of the second structure 340, after the first plating step, the top surface area of the second layer 338B of the second support body is larger than that of the first layer 338A of the second support body.

As shown in FIG. 12, the third resin 342, the second resin 334, and the first resin 324 are then removed using a solvent such as acetone. Thus, through-holes 343 are formed in the support 346, and gaps 344 are formed in portions where the first resin 324 was removed to serve as paths from the external that communicate with the lift-off layer 304.

Figure 13:
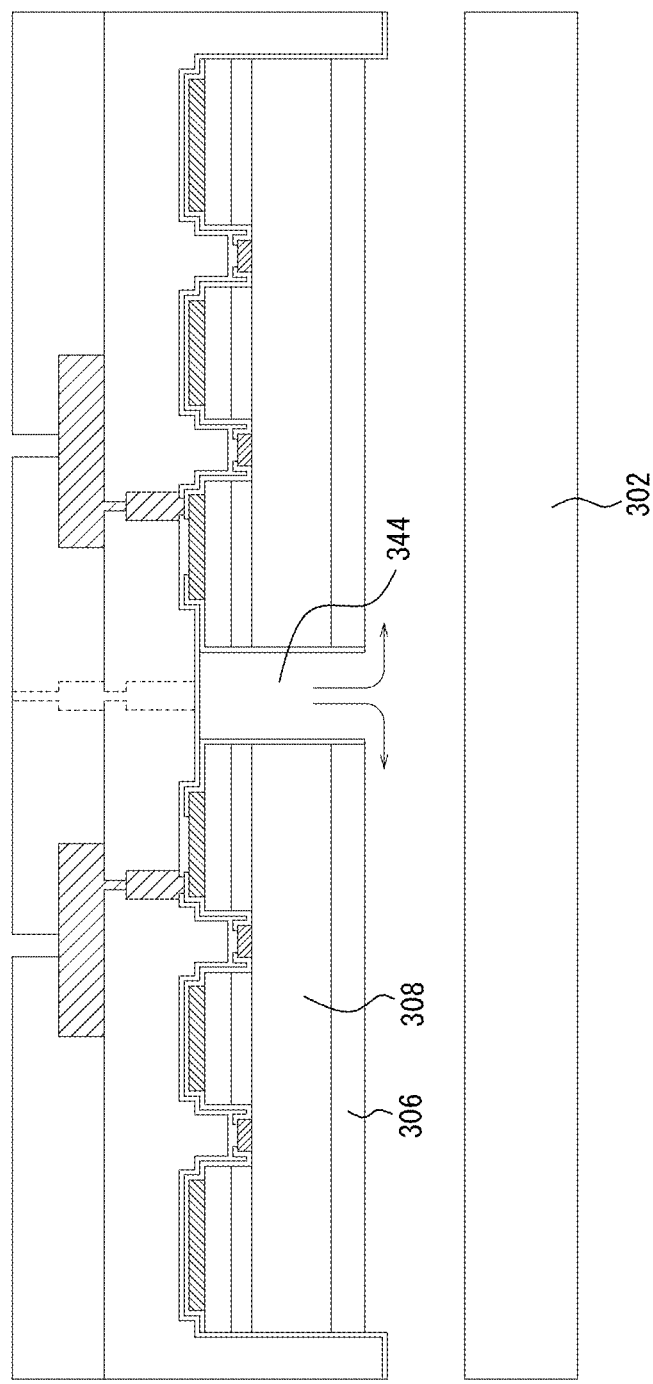
FIG. 13 is a schematic cross-sectional side view showing the step following the step shown in FIG. 12.

Next, as shown in FIG. 13, an etchant is supplied to the gaps 344 and the lift-off layer 304 is removed using a chemical lift-off process, thereby separating the growth substrate 302. In this embodiment, only one side surface of the four side surfaces of each semiconductor structure constitutes part of the gaps 344. Accordingly, the removal of the lift-off layer 304 progresses in one direction (directions shown by the arrow in FIG. 13) from the side constituted by the gap 344.

Figure 14:
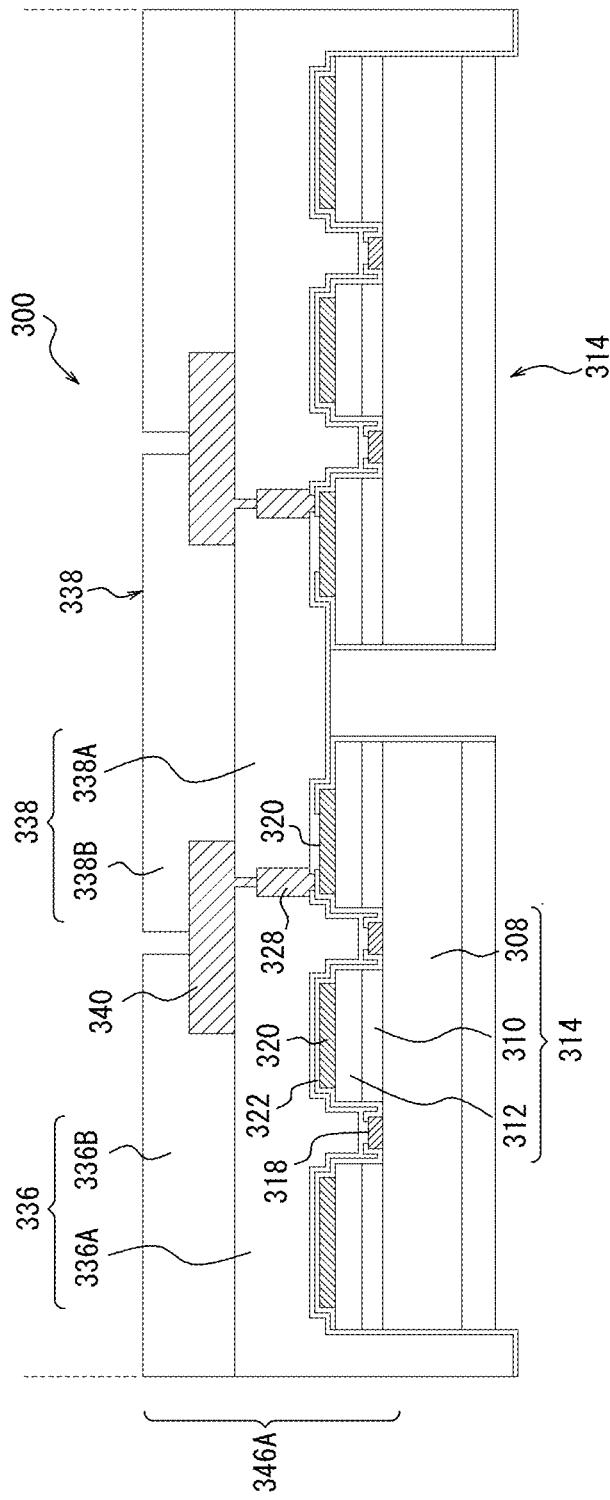
FIG. 14 is a schematic cross-sectional side view showing the step following the step shown in FIG. 13.

Finally, the singulation step for cutting the support 346 is performed as shown in FIG. 14. The cutting is performed along the broken lines in FIG. 14. In FIG. 14, the projection of the through-holes 343 is omitted. As described above, also in this embodiment, as in Embodiment 1, the support 346 is cut along all the grooves other than the grooves provided with the first filler 324, so that a plurality of III nitride semiconductor devices 300 in which the cut supports 346A each support two semiconductor structures 314 can be obtained as shown in FIG. 14. The supports 346A include the first and second support bodies 336, 338 and the first and second structures 328, 340.

According to a manufacturing method of this embodiment, as in Embodiment 1, both X-shaped cracks and crack spots formed at a center region of the semiconductor structures can be suppressed, and the number of cuttings can be reduced than in the case of cutting the support along all the grooves, so that III nitride semiconductor devices can be efficiently manufactured.

Further, the support 346 are not provided by bonding using bumps, but by plating growth, so that the growth substrate is not required to be aligned with respect to the support and misalignment is not caused. Therefore, III nitride semiconductor devices can be fabricated at a higher yield than the conventional methods.

The III nitride semiconductor device 300 will be described with reference to FIG. 14. The III nitride semiconductor device 300 includes a semiconductor structure 314 having an n-layer 308, an active layer 310, and a p-layer 312 in this order. An n-side contact layer 318 is formed on the n-layer 308 at the bottom of recessed portions penetrating the p-layer 312 and the active layer 310. Further, a p-side contact layer 320 is provided on the p-layer 312. Insulating layers 322 for insulation between the n-side contact layers 318 and the p-side contact layers 320 are provided on part of the n-side contact layers 318, part of the p-side contact layers 320, and the semiconductor structures 314 situated between the n-side contact layers 318 and the p-side contact layers 320. On the insulating layers 322, a single first support body 336, a single second support body 338, and structures 328 and 340 made of an insulator and located between the adjacent first and second support bodies 336 and 338 are provided. The first support body 336 is partly in contact with the n-side contact layers 318 to serve as an n-side electrode. The second support body 338 is partly in contact with the p-side contact layer 320 to serve as a p-side electrode. The first and second support bodies 336 and 338, and the structures 328 and 340 serve as a support 346A for supporting the semiconductor structure 314. The two semiconductor structures 314 are situated such that one side surface of one of the semiconductor structures 314 is placed to face one side surface of the other of them. Further, the supports 346A cover three side surfaces of the four side surfaces of the semiconductor structures 314.

In this embodiment, both the n-side electrode and p-side electrode serve as the supports 346A. A first part of the p-side electrode that is connected to one of the semiconductor structures (the second support body 338 on the left side in FIG. 14) is adjacent to a second portion thereof that is connected to the other of the semiconductor structures (the second support body 338 on the right side in FIG. 14), so that the support 346A has an arrangement of n-side electrode/p-side electrode/n-side electrode. Accordingly, in this embodiment, the p-side electrode which tends to have a smaller area than the n-side electrode is integrated to be larger, which makes it easier to make the connection in packaging the device. Further, the area required can be reduced than in the case where two separate devices are arranged. Note that even in the case where the second plating step is not performed, the same advantageous effects can be achieved.

In accordance with the III nitride semiconductor device 300 of this embodiment, since under-filling having low heat dissipation performance is not used, and the first and second support bodies 336 and 338 having high heat dissipation performance, which are grown by plating constitute the main support body, good heat dissipation is achieved, and the junction temperature can be lowered. Therefore, the III nitride semiconductor device can be operated at a higher current.

In the III nitride semiconductor device 300 of this embodiment, the semiconductor structures 314 have recessed portions at a plurality of positions and the n-side contact layers 318 at a plurality of positions. This allows current to be flown uniformly in the device, which leads to improved device characteristics (light output power in the case of LEDs). The arrangement of the n-side contact layers is not limited to that in FIG. 16A. For example, it is also preferable that the n-side contact layers have a circular shape with a diameter of 20 μm to 40 μm and they are provided at 16 positions in total at intersections of a 4×4 orthogonal grid at regular intervals. Alternatively, they may be arranged to be offset to the peripheral side of a chip in order to unify the current density, or may be arranged in a hexagonal close arrangement.

Further, the first and second support bodies 336 and 338 include first layers 336A and 338A provided on the insulating layers 322, and second layers 336B and 338B provided on the first layers 336A and 338A, respectively. The structures 328 and 340 include the first structure 328 positioned between the first layers 336A and 338A of the first and second support bodies, and the second structure 340 coupled to the first structure 328 and situated between the second layers 336B and 338B of the first and second support bodies.

Here, the top surface area of the second layer 338B of the second support body is larger than that of the first layer 338A of the second support body. This structure can be fabricated by the two-stage plating described above. When a plurality of n-side contact layers 318 are provided, the first layer 338A of the second support body cannot be prevented from being significantly small as compared with the first layers 336A of the first support body. However, using the two-stage plating, the top surface area of the second layer 338B of the second support body can be made larger than that of the first layer 338A of the second support body. In this case, when the III nitride semiconductor device 300 is mounted on a separate package substrate or printed wiring board, etc., the alignment can be easily performed.

Embodiment 3

Figure 17A:
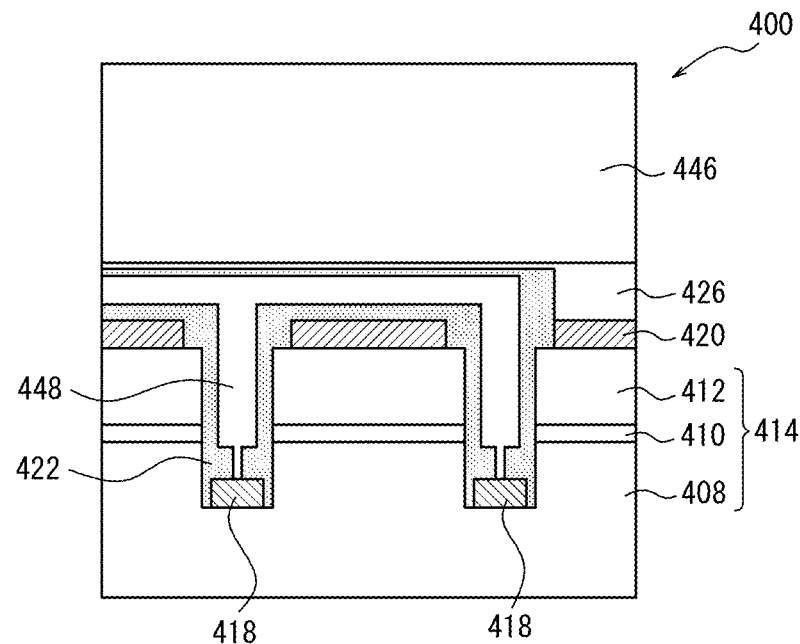
Figure 17B:
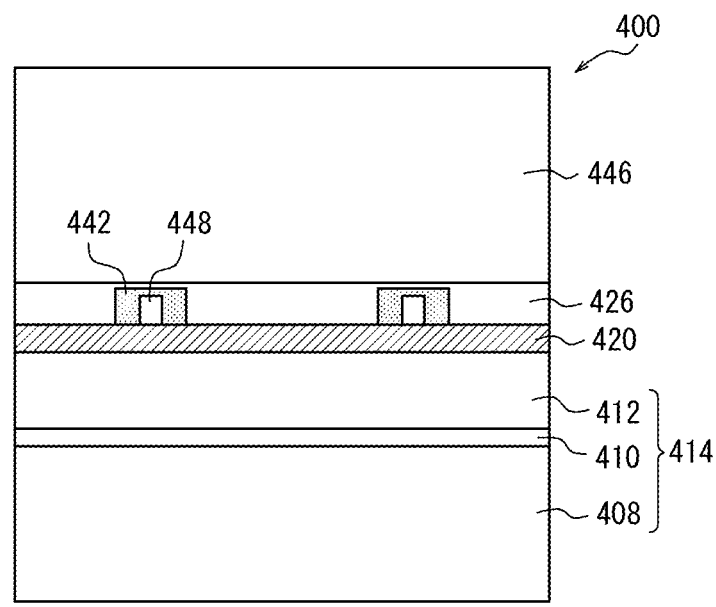
FIG. 17B is a view showing a cross section perpendicular to FIG. 17A.
Figure 18A:
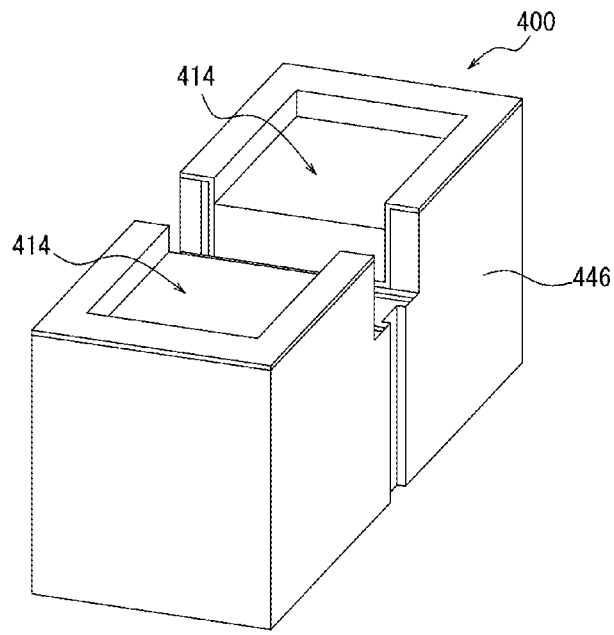
FIG. 18A is a schematic perspective view of III nitride semiconductor device 400.
Figure 18B:
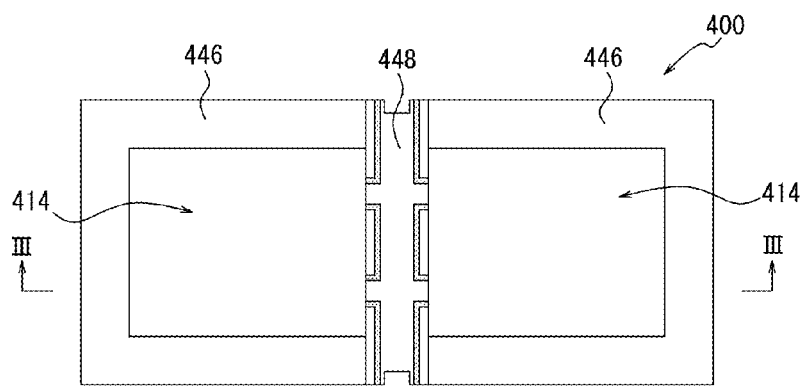
FIG. 18B is a top view of the III nitride semiconductor device 400.
Figure 18C:
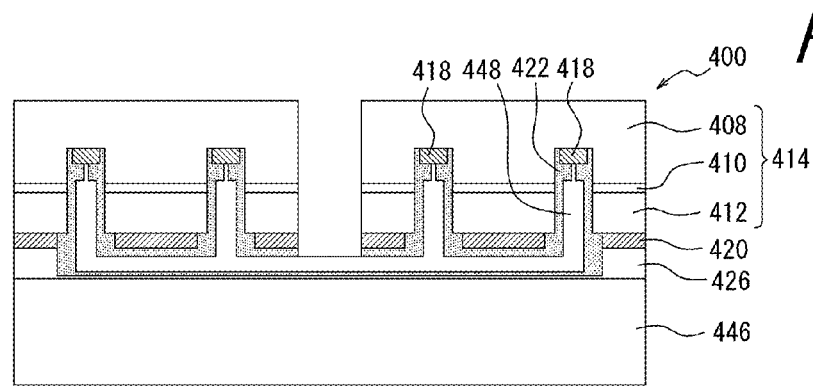
FIG. 18C is a cross-sectional view of FIG. 18B taken along line III-III.
Figure 19A:
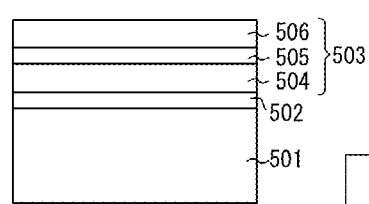
FIGS. 19A to 19F are schematic cross-sectional views illustrating the steps of a conventional method of manufacturing conventional vertically structured III nitride semiconductor LED chips 500.
Figure 19B:
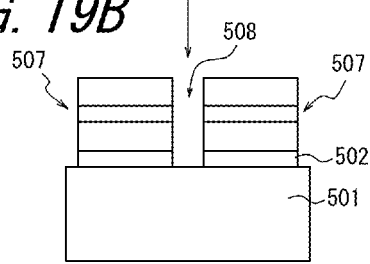
Figure 19C:
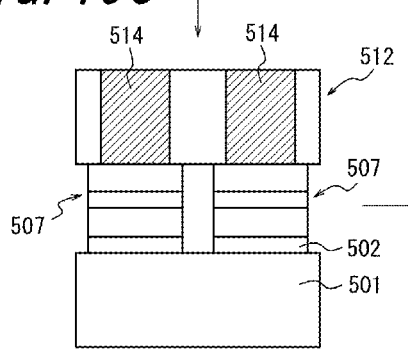
Figure 19D:
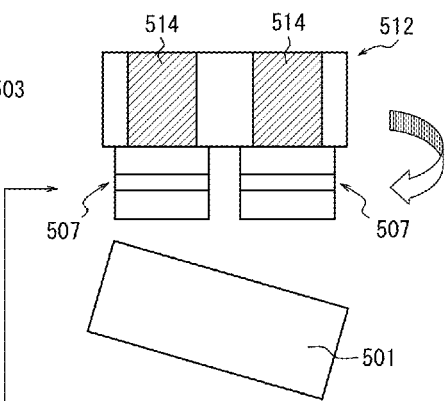
Figure 19E:
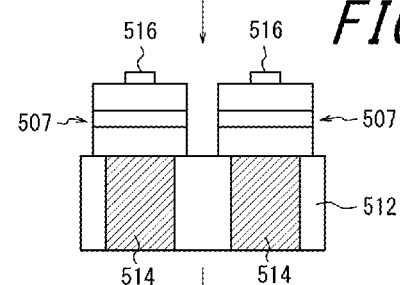
Figure 19F:
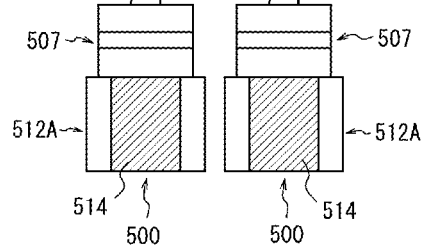

Next, a III nitride semiconductor device 400 according to another embodiment of the present invention will be described with reference to FIGS. 17A to 18B. This embodiment will be described focusing on differences from Embodiments 1 and 2. FIG. 17A is a cross-sectional view illustrating a part of the III nitride semiconductor device 400, which is a device on only the right side in the stage shown in FIG. 14 of Embodiment 2. FIG. 17B is a view showing a cross section perpendicular to FIG. 17A. FIG. 18A is a schematic perspective view of the III nitride semiconductor device 400, and FIG. 18B is a top view of the III nitride semiconductor device 400. FIG. 18C is a cross-sectional view taken along line III-III in FIG. 18B.

This embodiment is the same as Embodiments 1 and 2 in that alternate lines of grooves are filled up with a filler in one direction, etching of a lift-off layer is performed from only one surface of each semiconductor structure, and a support is cut along the grooves other than the grooves provided with the filler. Accordingly, as shown in FIG. 18A, in the III nitride semiconductor device 400, two semiconductor structures 414 are placed such that one side surface of one of the two semiconductor structures face one side surface of the other of them, and the other three side surfaces are covered with a support 446.

The III nitride semiconductor device 400 has the support 446 and two semiconductor structures 414 (only one of them is shown in the diagram) provided on the support 446, and the semiconductor structures 414 have a p-layer 412, an active layer 410, and an n-layer 408 in this order as shown in FIGS. 17A and 17B. A p-side contact layer 420 is provided on the p-layer 412, and the support 446 grown from a plating seed layer 426 by plating serves as a p-side electrode. Meanwhile, an n-side contact layer 418 is provided on the n-layer 408. Further, in this embodiment, n-side electrodes 448 are surrounded by insulating layers 422 and led out as wirings from between the support 446 and the semiconductor structures 414. Here, as shown in FIGS. 18B and 18C, the n-side electrodes 448 are led out from a surface of the semiconductor structures that is not covered with the support 446 and are exposed between two semiconductor structures 414.

Also in this embodiment, the area of part of the n-side electrodes that is exposed can be twice as large as in the case of cutting the support along all the grooves to perform singulation, which makes it easier to make the connection in packaging the device. Further, the area required can be reduced than in the case where two separate devices are arranged. Note that if cutting is performed along the grooves provided with the filler by laser dicing or the like, an altered layer may be formed by melting or metal and the like scatter around. Thus, a short circuit is easily established not only the facing side surfaces of the semiconductor structures 414 but between the n-side electrodes 448 and the support 446. Therefore, this embodiment is preferred in such a case where the n-side electrodes are led out in the transverse directions. As a variant of Embodiment 3, as in Embodiment 2 above, a support communicating with the n-side electrodes may be added to part of the support 446, so that the support 446 has an arrangement of p-side electrode/n-side electrode/p-side electrode.

Preferred illustrative embodiments of the steps of the embodiments above will be described. For structures that are common to a plurality of embodiments are described using only reference numerals of Embodiment 1.

A sapphire substrate or an AlN template substrate in which an AlN film is formed on a sapphire substrate is preferably used as the growth substrate 102. The growth substrate may be selected depending on the kind of the lift-off layer to be formed, the composition of Al, Ga, and In of the semiconductor structure laminate made of a III nitride semiconductor, the quality of LED chips, the cost, and the like.

In the case of using a chemical lift-off process, the lift-off layer 104 is preferably a buffer layer made of a metal other than III metals or a nitride thereof, such as CrN, since it can be dissolved by selective chemical etching. The lift-off layer 104 is preferably deposited by sputtering, vacuum deposition, ion plating, or MOCVD. Typically, the thickness of the lift-off layer 104 is approximately 2 nm to 100 nm.

The i-layer 106, n-layer 108, active layer 110, and the p-layer 112 are made of any given III nitride semiconductor such as GaN or AlGaN. If the active layer 110 is as a light emitting layer having a multiple quantum well (MQW) structure using a III nitride semiconductor, LEDs are obtained. If the active layer 110 is not a light emitting layer, other types of semiconductor devices are obtained. These layers can be epitaxially grown on the lift-off layer 104, for example by MOCVD. The first conductivity type is n-type and the second conductivity-type is p-type in this embodiment; however, naturally, the opposite combination is possible.

The grooves 116 are preferably formed by dry etching. This is because the end points of etching of the semiconductor laminate 113 made of a III nitride semiconductor layer can be reproducibly controlled. In the present invention, the transverse cross sectional shape of the semiconductor structures 114 is not limited in particular as long as it is approximately quadrangular; however, it is preferably rectangular in terms of the effective area. "Nearly quadrangular shape" here includes, for example, a quadrangle having corners that are rounded or beveled to some degree, besides a quadrangle. Note that in terms of keeping etching in one direction, the side surface 150A to be first supplied with an etchant necessarily has some straight region so as not to inhibit the effect of suppressing crack formation in the present invention.

The semiconductor structures 114 each have a side of generally 250 μm to 3000 μm. Further, the width of the grooves 116 is preferably in the rage of 40 μm to 200 μm, more preferably in the range of 60 μm to 100 μm. The width of 40 μm or more allows the etchant to be supplied to the grooves 116 smoothly enough, whereas the width of 200 μm or less allows the loss of light emitting area to be minimized.

The step of partly removing the p-layer 312 and the active layer 310 to partly expose the n-layer 308 in Embodiment 2 and Embodiment 3 is preferably performed by dry etching using resist as a mask. This allows the termination of the etching on the n-layer 308 to be reproducibly controlled. The n-side contact layer 318 can be formed by a lift-off process using resist as a mask. For the electrode material, Al, Cr, Ti, Ni, Ag, Au, or the like is used. The p-side contact layer 320 can be formed by a lift-off process using resist as a mask. For the electrode material, Ni, Ag, Ti, Pd, Cu, Au, Rh, Ru, Pt, Ir, or the like is used.

The insulating layer 122 is made of for example, $SiO_2$, SiN, or the like, and after it is formed to 0.5 μm to 2.0 μm by PECVD, resist patterns are formed as masks by wet etching or dry etching. According to the circumstances, the insulating layer can be formed using a metal mask, by sputtering or by coating.

The first resin 124 can be formed by a given patterning technique by applying a given resist material. This also applies to the second resin 134 and the third resin 342.

In Embodiment 2, the first structure 328 and the second structure 340 are made of a material different from the above described material of the first resin 124, and they constitute part of a device as the support. For such an insulating material, for example, a resin such as epoxy resin or polyimide, or an inorganic material such as $SiO_2$ or SiN can be used. Those structures may be formed by a given patterning technique; however, photoresist for permanent films (SU-8, for example) used for example in microelectromechanical systems (MEMS) can simplify the process. Desirably, the heights of the first structure 328 and the second structure 340 are 10 μm to 100 μm, and the widths thereof are 10 μm to 100 μm, and 500 μm to 900 μm, respectively.

The support 146 (the first support body 336 and the second support body 338 in Embodiment 2) is formed by a plating process such as wet plating or dry plating. For example, Cu or Au electroplating is employed; Cu, Ni, Au, or the like can be used for a surface of a plating seed layer 126 (on the conductive support side). In this case, for the growth substrate side (the semiconductor structures side) of the plating seed layer 126, a metal having sufficient adhesion with the semiconductor structures 114 and the insulating layers 122, for example, Ti or Ni is preferably used. The plating seed layer 126 can be formed for example by sputtering. The thickness of the plating seed layer 126 can be 2.0 μm to 20 μm, whereas the thickness of the first support body 336 and the second support body 338 can be approximately 10 μm to 200 μm.

The first resin 124, second resin 134, and third resin 342 can be removed using a solvent in which resins are soluble, for example, acetone, alcohols, or the like. On that occasion, the plating seed layer 126 between the first resin 124 and the second resin 134 is not dissolved by acetone or the like; however, since the plating seed layer 126 is an extremely thin film as compared with the first resin 124 and the second resin 134, it can be easily removed. The removal may be performed mechanically or may be performed by metal etching or the like. On that occasion, the first structure 328 and the second structure 340 are ensured not to be removed.

The removal of the lift-off layer 104 is performed by a typical chemical lift-off process or a photochemical lift-off process. A chemical 30) lift-off process is a method of etching a lift-off layer. In particular, a method for etching a lift-off layer while activating it by irradiation with light such as ultraviolet light is called a photochemical lift-off process. When the lift-off layer is made of CrN, examples of possible etchants are publicly known selective etchants including a diammonium cerium nitrate solution and a 36 potassium ferricyanide-based solution. Whereas when the lift-off layer is made of ScN, examples of such etchants can include hydrochloric acid, nitric acid, and organic acid.

After lift-off, the growth substrate 102 is preferably attached to the support 146 with the plating seed layer 126 therebetween. This can prevent the formation of not only center cracks and X-shaped cracks but also edge cracks formed at the portion where etching ends (on the side surface 150C side). Accordingly, it is preferable that the plating seed layer 126 is unetchable with the etchant used for lift-off or etchable therewith to an extent where the growth substrate can remain attached to the plating seed layer 126 even after the lift-off. The growth substrate 102 can be mechanically peeled or can be separated by chemically removing part of the plating seed layer 126 by applying a specific etchant to the portions where the plating seed layer 126 is in contact with the growth substrate 102.

The surface of the i-layer 306, which has been exposed by the removal of the lift-off layer 304 is preferably cleaned by wet cleaning. Subsequently, dry etching and/or wet etching may be performed to a given extent to expose the n-layer 308. For the III nitride semiconductor device 300 according to Embodiment 2 of the present invention, both the n-side electrode and the p-side electrode are provided on the support 346 side, so that etching on the surface exposed by removing the lift-off layer 304 is optional. When the device 300 is an LED, the exposed surface serves as a light extraction surface. Therefore, preferably, the surface is subjected to wet etching for the formation of irregularities and is covered with a protective film of $SiO_2$ or the like in order to ensure reliability in moisture resistance or the like.

The support 146 can be cut using for example a blade dicer or a laser dicer. Further, although examples of cutting the support along all the grooves other than the grooves provided with the first resin have been described in Embodiments 1 to 3 above, the present invention is not limited thereto. Alternatively, the support can be cut along part of the grooves other than the grooves provided with the first resin. In that case, depending on the manner of cutting, III nitride semiconductor devices having m rows and n columns of the semiconductor structures (where m is an integer, and n is an even number) in which the plurality of III nitride semiconductor devices shown in FIGS. 6, 7, 14, etc. are integrated with the support.

EXAMPLES

Example 1

LED chips shown in FIG. 6 were manufactured by the method shown in FIGS. 1A to 5B. Specifically, first, a Cr layer was formed on a sapphire substrate by sputtering and heat treatment was performed in an atmosphere containing ammonia to form a lift-off layer (CrN layer, thickness: 18 nm). After that, an n-type GaN layer (thickness: 7 µm), a light emitting layer (InGaN based MQW layer, thickness: 0.1 µm), and a p-type GaN layer (thickness: 0.2 µm) were epitaxially grown sequentially thereon by MOCVD. Thus, a semiconductor laminate was formed. The semiconductor laminate was then partly removed by dry etching to partly expose the sapphire substrate to form grooves in a grid pattern, thereby forming a plurality of separate island-like semiconductor structures each having a square transverse cross section. The width W of the semiconductor structures was 1200 µm, and the devices were arranged in a matrix. The pitch between the devices was 1300 µm; accordingly, the groove width was 100 µm.

An ohmic electrode layer (Ag, thickness: 0.2 µm) was formed on the p-type GaN layer by EB vapor deposition. Further, an insulating layer ($SiO_2$, thickness: 0.6 µm) was formed by plasma chemical vapor deposition, part of the insulating layer other than the part covering the three side surfaces of each semiconductor structure that were not covered with resin and covering part of the top of the semiconductor structure was removed by etching. After that, in order to provide gaps for supplying an etchant, alternate lines of the grooves were filled up with resin (photoresist) in the longitudinal direction as shown in FIG. 4B. Subsequently, plating seed layers (Ti/Ni/Au, thickness: 0.02 µm/0.2 µm/0.6 µm, respectively) were formed by sputtering on the surface of the semiconductor structures (specifically, on the surface of the above ohmic electrode layer and the insulating layer), the surfaces of the resin, and the exposed bottom and side surfaces of the grooves.

Next, 100 µm square pillars for forming through-holes were formed using resin (thick film photoresist, thickness: 30 µm) by photolithography at the positions shown in FIG. 4B. After that, Cu (thickness: 100 µm on the semiconductor laminate) was deposited as a support on the plating seed layers by plating. The plating was electroplating using a copper sulfate-based electrolyte solution, where the temperature of the solution was in the range of 25° C. to 30° C., and the deposition rate was 35 µm/hr. Thus, embedded parts of Cu plating were formed in the grooves in which the plating seed layers had been formed. Here, regions provided with the pillars for forming through-holes were not plated with Cu, and through-holes were formed by removing the pillars using acetone so as to lead to the grooves provided with the resin through the conductive support. After the pillars were removed using acetone, the plating seed layers right under the through-holes were removed using a HF-added Au etchant. Via those through-holes, the resin in the grooves were subsequently removed using acetone, thereby forming gaps.

After that, the lift-off layer was removed by a chemical lift-off process using a Cr selective etching solution as an etchant. Meanwhile, the etchant was supplied to the lift-off layer through the above through-holes due to immersion in the etchant, and the lift-off layer was first etched only from one side surface of each semiconductor structure. Subsequently, the sapphire substrate side was slightly dipped in a BHF solution, thereby dissolving Ti in a portion of the plating seed layers attached to the sapphire substrate at the bottom of the grooves. Thus, the sapphire substrate was separated.

The semiconductor structures were observed after lift-off with an optical microscope (magnification: 200× and 1000×) and the formation of macro/microcracks was examined. The number of the examined light emitting structures was 2000, and no macro/microcracks were observed.

After that, the exposed n-type GaN layer was etched 3 µm in the thickness direction by dry etching, and besides, the surface thereof was made rough using a KOH solution. N-type ohmic electrodes were then formed on the n-type GaN layer by sputtering using Ti/Al, and pad electrodes were also formed using Ni/Au. Subsequently, an insulating layer ($SiO_2$, thickness: 0.3 µm) was formed on the surface and the side surfaces of the semiconductor structures that were exposed, and on the exposed surface of the embedded parts by plasma chemical vapor deposition. The insulating layers on the pad electrodes were partly removed by etching to expose the top of the pad electrodes.

The support was cut using a laser dicer along the grooves other than the grooves provided with the resin, thereby forming light emitting devices having the structure shown in FIG. 6, in which two semiconductor structures were supported by the support and three side surfaces of the four surfaces of the semiconductor structures covered with the embedded parts. In this example, the number of cuttings was successfully reduced than in the case of cutting the support along all the grooves, so that light emitting devices were efficiently manufactured.

Comparative Example

LED chips were manufactured by a conventional manufacturing method shown in FIGS. 19A to 20B. Specifically, first, the same semiconductor laminate as Example was formed on a sapphire substrate and the semiconductor laminate was then partly removed by dry etching to partly expose the sapphire substrate to form grooves, thereby forming a plurality of separate island-like semiconductor structures each having a 1000 μm diameter circular transverse cross-sectional shape. The device pitch between the semiconductor structures was 1250 μm.

Figure 20A:
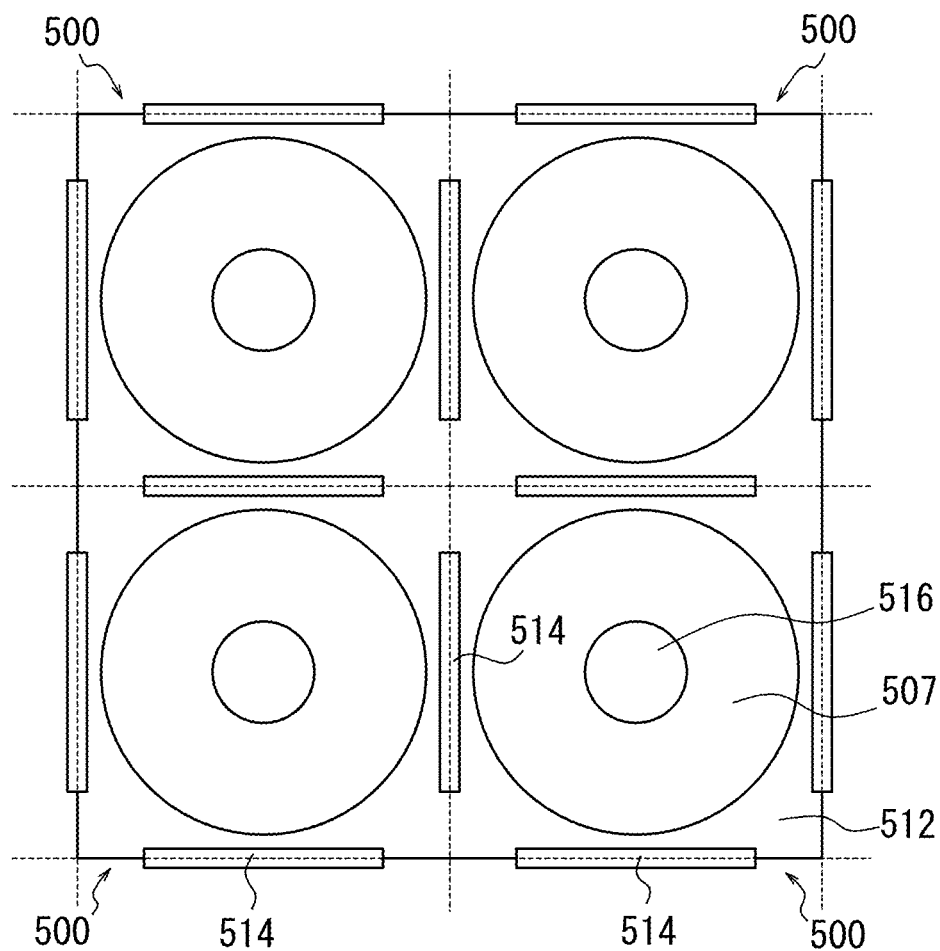
Figure 20B:
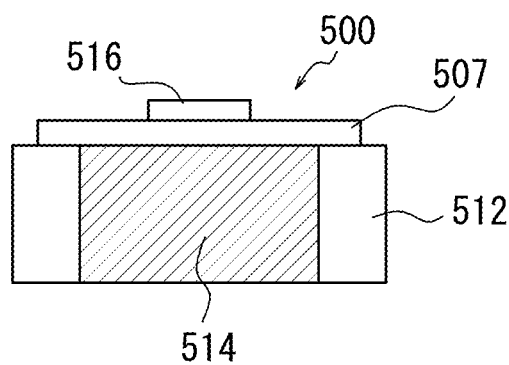
FIG. 20B is a schematic side view of one of the LED chips 500 singulated along the broken lines in FIG. 20A.
Figure 21A:
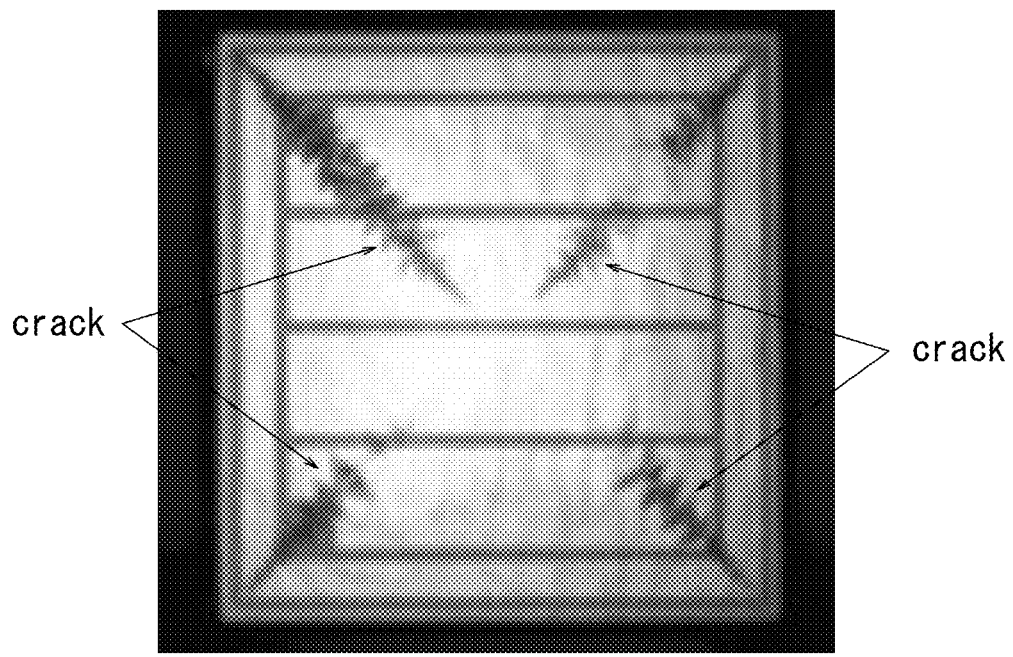
Figure 21B:
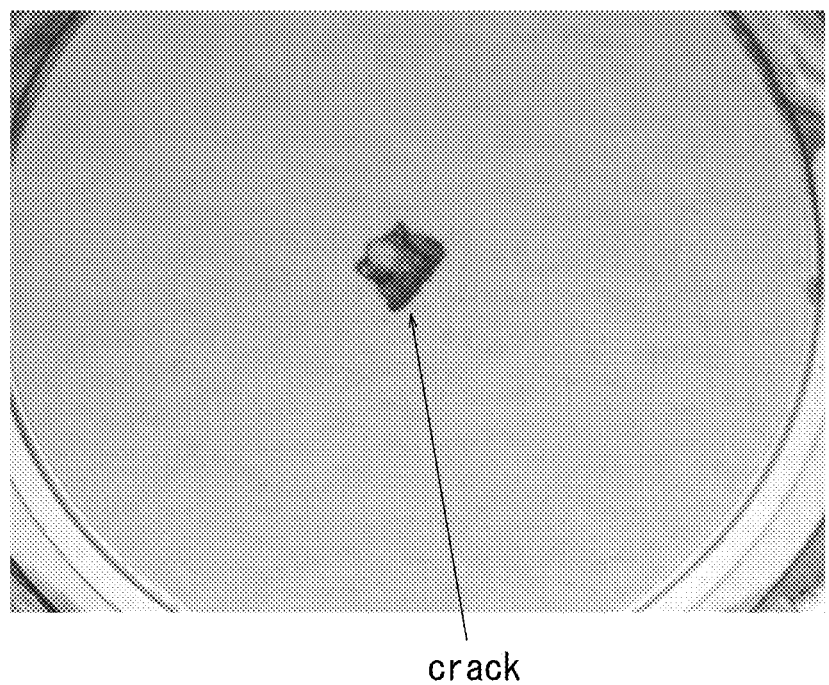
FIG. 21B is a photograph showing a crack formed in an LEI) chip obtained by the conventional manufacturing method shown in FIG. 19A to FIG. 20B.

The same ohmic electrode layer as Example was formed on the p-type layer of each separate semiconductor structure, and all the grooves were then filled with photoresist. Meanwhile, an opening was formed in the portion of the p-type ohmic electrode layer of each semiconductor structure, and plating seed layers (Ni/Au/Cu) were formed therein. Next, pillars of thick film resists were formed to prevent a Cu film from being formed in plating to be described. The pillars were formed on the grid lines surrounding the semiconductor structures as shown in FIG. 20A. Note that portions of the connection layer on the pillar formation positions were previously removed by etching.

Next, electroplating with Cu was performed using a copper sulfate-based electrolyte solution to form a 80 μm support. The solution temperature was in the range of 25° C. to 30° C., and the deposition rate was 25 μm/hr. Subsequently, the pillars and the resists provided in the grooves were removed using acetone, thereby forming through-grooves penetrating the support. Note that the through-grooves shown in FIG. 20A were formed to have four sides with a width of 70 μm and a length of 900 μm.

After that, the lift-off layer was removed by a chemical lift-off process using a Cr selective etching solution as an etchant, thereby separating the sapphire substrate. At that time, the lift-off layer was etched from the peripheral portion of each semiconductor structure to the center portion thereof. Accordingly, the lift-off layer at the center portion was removed in the end.

The semiconductor structures were observed after lift-off with an optical microscope and it was found that X-shaped cracks widely extending from the corners to the center portion were formed in 38 out of 1900 of the examined semiconductor structures (incidence was 2.0%) in Comparative Example and that crack spots were formed in the central region of 1045 of the semiconductor structures, and the incidence was 55.0%.

Example 2

Steps of FIG. 8A to FIG. 10B were performed and without performing two-stage plating after that, LED chips were fabricated by a chemical lift-off process. Specifically, first, as shown in FIG. 8A, a Cr layer was formed on a sapphire substrate by sputtering and heat treatment was performed in an atmosphere containing ammonia to form a lift-off layer (CrN layer, thickness: 18 nm). After that, an i-type GaN layer (thickness: 4 μm), an n-type GaN layer (thickness: 6 μm), a light emitting layer (AlInGaN based MQW layer, thickness: 0.1 μm), and a p-type GaN layer (thickness: 0.2 μm) were epitaxially grown sequentially thereon by MOCVD.

Subsequently, as shown in FIG. 8B and FIG. 16A, the p-type GaN layer, the light emitting layer, the n-type GaN layer, and the i-type GaN layer were partly removed by dry etching to form grooves in a grid pattern, forming a plurality of semiconductor structures each having a square transverse cross sectional shape, arranged longitudinally and laterally. The semiconductor structures had a side length of 1500 μm, whereas the groove s had a maximum width of 100 μm.

Further, the p-type GaN layer and the light emitting layer were partly removed by ICP-RIE dry etching using resist as a mask to partly expose the n-type GaN layer. Exposed portions of the n-type GaN layer are arranged at four positions in each device in FIG. 16A, however, they were arranged at 16 positions in this example and had a diameter of 60 μm.

Next, as shown in FIG. 9A and FIG. 15B, after resist was prepared as a mask, circular n-side contact layers (material: Cr/Ni/Ag, thickness: 50 nm/20 nm/400 nm) were formed on the exposed portions of the n-type GaN layer by EB deposition, and the resist was removed. Further, after preparing resist as a mask, p-side contact layer (material: Ni/Ag/Ni/Ti, thickness: 5 angstroms/200 nm/25 angstroms/25 angstroms) was formed over substantially the entire surface of the p-type GaN layer by EB deposition, and the resist was removed.

Next, as shown in FIG. 9B and FIG. 16A, after an insulating layer (SiO$_2$, thickness: 0.7 μm) was formed on substantially the whole surface by PECVD, the insulating layer was partly wet etched by BHF using resist as a mask, thereby exposing part of the n-side contact layers and part of the p-side contact layer. The exposed portions of the n-side contact layers had a diameter of 30 μm, and the exposed portion of the p-side contact layer had a width of 60 μm. Further, alternate lines of the grooves in a grid pattern were filled up with photoresist (width: 100 μm, height: 10 μm) in the longitudinal direction using photolithography.

Next, as shown in FIG. 10A, a plating seed layer (Ti/Ni/Au, thickness: 0.02 μm/0.2 μm/0.6 μm) was formed on substantially the whole surface of the exposed surface on the top surface side of the wafer by sputtering. Using resist as a mask, the insulating layer of only the positions shown in FIG. 10A was exposed. The width of the exposed portions of the insulating layer was 50 μm. Thus, the plating seed layers were partitioned into a region a where a first support body to be described would be formed and a region where the second support body would be formed, thus electrically separating the regions.

Further, a first structure (width: 100 μm, height: 30 μm) made of SU-8 was formed to cover the exposed portions of the insulating layer using photolithography. In a similar manner, photoresist (width: 550 μm, height: 30 μm) was additionally formed to the same height as the first structure using photolithography on the photoresist formed on the alternate lines of the grooves.

Next, as shown in FIG. 10B and FIG. 16B, Cu was formed from the plating seed layer by plating to form first layers (thickness on p-type GaN layer: 40 μm) of the first and second support bodies. The plating was electroplating using a copper sulfate-based electrolyte solution, where the temperature of the solution was in the range of 25° C. to 30° C., and the deposition rate was 35 μm/hr. The widths of the first layers of the first and second support bodies were 1200 μm and 150 μm, respectively. The first support body and the second support body were electricity separated by the first structure.

After that, only the photoresist provided in the grooves was removed using acetone to form a gap communicating with the sapphire substrate and the lift-off layer.

A selective etchant for the lift-off layer was supplied to the gap and the lift-off layer was removed by a chemical lift-off process, thereby separating the sapphire substrate.

After that, the i-type GaN layer exposed by the removal of the lift-off layer was dry etched using an ICP-RIE apparatus. Finally, the first support body and second support body were cut along the grooves other than the grooves provide with the resin using a laser dicer, thereby obtaining 600 LED chips according to Example 2.

Cracks were found in 0 out of 600 of the examined semiconductor structures (i.e., the incidence was 0%). Further, in this example, the number of cuttings was successfully reduced than in the case of cutting the support 3$i$ along all the grooves, so that light emitting devices were efficiently manufactured. Furthermore, the support had an arrangement of n-side electrode/p-side electrode/n-side electrode, so that the connection was easily made in packaging the device.

Example 3

LED chips shown in FIG. 14 were fabricated by a manufacturing method using two-stage etching shown in FIGS. 8A to 14. The steps up to FIG. 10B and FIG. 16B are the same as those in Example 2, so the description will be omitted.

Figure 11:
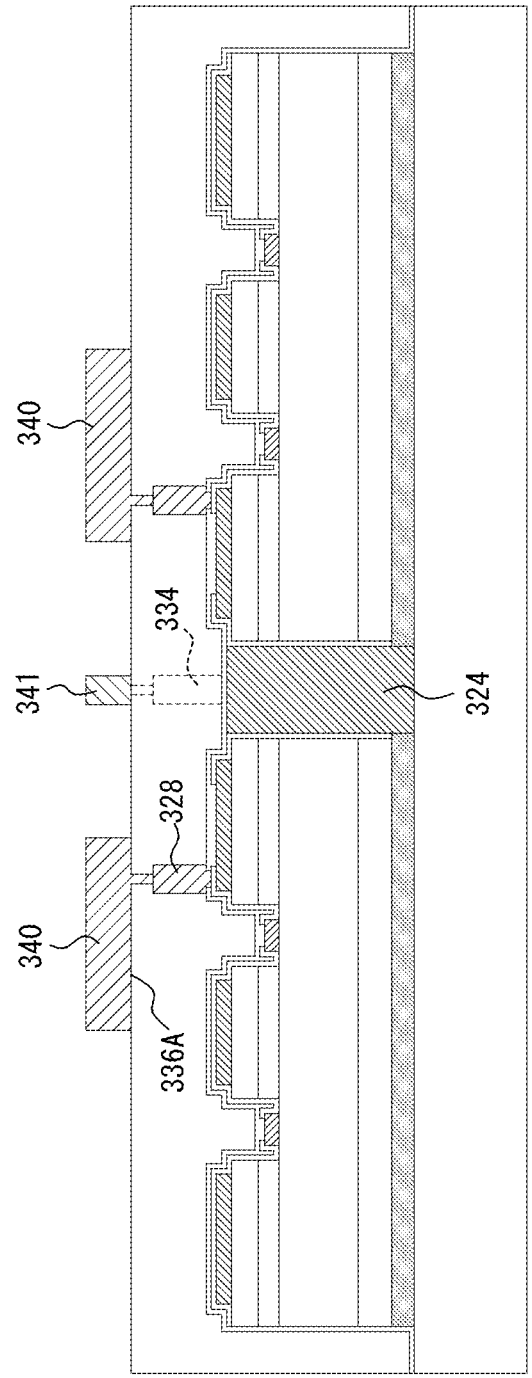
FIG. 11 is a schematic cross-sectional side view showing the step following the step shown in FIG. 10B.

After those steps, as shown in FIG. 11, a second structure (width: 550 μm, height: 30 μm) made of SU-8 and coupled to the first structure was formed on the first layer of the first support body using photolithography. In a similar manner, photoresist (width: 80 μm, height: 25 μm) was additionally formed using photolithography above the photoresist formed on the alternate lines of the grooves.

Next, as shown in FIG. 12, Cu is further formed from the first layers of the first support body and second support body by plating, thereby forming second layers (thickness on first layer: 200 μm) of the first and second support bodies. The plating was electroplating using a copper sulfate-based electrolyte solution, where the temperature of the solution was in the range of 25° C. to 30° C., and the deposition rate was 35 μm/hr. The widths of the second layers of the first and second support bodies were 930 μm and 310 μm, respectively. Thus, by two-stage plating, the top surface area of the second layer of the second support body after the first plating step was made larger than that of the first layer of the second support body.

The steps following the removal of the lift-off layer are the same as those in Example 2, so the description will be omitted. Thus, 600 LED chips according to Example 3 were obtained.

Cracks were found in 0 out of 600 of the examined semiconductor structures (i.e., the incidence was 0%). The other advantageous effects were also the same as those in Example 2.

INDUSTRIAL APPLICABILITY

The present invention can provide a high quality III nitride semiconductor device in which, not only X-shaped cracks extending from the vicinity of the corners of semiconductor structures to the center portion thereof, but also crack spots at the center portion can be prevented from being formed and can provide a method of efficiently manufacturing the III nitride semiconductor device.

REFERENCE SIGNS LIST

100: III nitride semiconductor device
102: Growth substrate
104: Lift-off layer
108: n-type III nitride semiconductor layer
110: Active layer
112: p-type III nitride semiconductor layer
113: Semiconductor laminate
114: Semiconductor structure
116: Groove
124: First resin (filler)
126: Plating seed layer
134: Resin pillar (Pillar)
146: Support
146A: Cut support
142: Embedded part
143: Through-hole
144: Gap
148: n-side electrode
150A: Side surface (Side surface to which etchant is initially supplied)
150B: Two opposite side surfaces
150C: Side surface (Side surface to which etchant reaches in the end of etching)
122: Insulating layer

The invention claimed is:

1. A method of manufacturing a III nitride semiconductor device, comprising the steps of:
a step of forming a semiconductor laminate obtained by sequentially stacking a first conductivity type III nitride semiconductor layer, an active layer, and a second conductivity type III nitride semiconductor layer on a growth substrate with a lift-off layer provided therebetween;
a step of partly removing the semiconductor laminate to form a plurality of grooves in a grid pattern such that the growth substrate is partly exposed at the bottom of the grooves, thereby forming a plurality of semiconductor structures having a nearly quadrangular transverse cross-sectional shape;
a step of filling up alternate lines of the plurality of grooves in one direction with a filler;
a step of forming a support for integrally supporting the plurality of semiconductor structures by plating;
a step of forming through-holes in the support, the through-holes communicating with the filler;
a step of forming gaps by removing the filler;
a step of supplying an etchant to the gaps from the through-holes, thereby etching the lift-off layer from only one side of each of the semiconductor structures to remove the lift-off layer;
a step of forming first and second electrodes electrically connected to the first and second conductivity-type III nitride semiconductor layers, respectively; and
a singulation step for cutting the support along the plurality of grooves,
wherein in the singulation step, the support is cut along at least part of the grooves other than the grooves provided with the filler, thereby manufacturing III nitride semiconductor devices in which the cut supports support respective m rows and n columns of the semiconductor structures (where m is a natural number, and n is an even number equal to or more than 2).

2. The method of manufacturing a III nitride semiconductor device, according to claim 1, wherein in the singulation step, the support is cut along all the grooves other than the grooves provided with the filler, thereby manufacturing a III nitride semiconductor device in which the cut supports each support two semiconductor structures.

3. The method of manufacturing a III nitride semiconductor device, according to claim 2,
   wherein at least one of the first and second electrodes also serves as the support, and
   a first part of the other of the first and second electrodes that is connected to one of the semiconductor structures and a second part thereof that is connected to the other of the semiconductor structures are placed adjacent to each other.

* * * * *